(12) United States Patent
Morita

(10) Patent No.: US 8,506,056 B2
(45) Date of Patent: Aug. 13, 2013

(54) PIEZOELECTRIC ACTUATOR AND LIQUID TRANSFER DEVICE

(75) Inventor: Yoshitsugu Morita, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 573 days.

(21) Appl. No.: 12/644,612

(22) Filed: Dec. 22, 2009

(65) Prior Publication Data

US 2010/0165057 A1    Jul. 1, 2010

(30) Foreign Application Priority Data

Dec. 26, 2008 (JP) ................. 2008-334916

(51) Int. Cl.
*B41J 2/045* (2006.01)
(52) U.S. Cl.
USPC ............................................. 347/68; 347/72
(58) Field of Classification Search
USPC ......................................................... 347/72
See application file for complete search history.

(56) References Cited

U.S. PATENT DOCUMENTS

| | | | | |
|---|---|---|---|---|
| 7,265,481 | B2 * | 9/2007 | Chang et al. ................. | 310/330 |
| 7,578,581 | B2 | 8/2009 | Watanabe | |
| 2005/0285911 | A1 | 12/2005 | Sugahara | |
| 2006/0125878 | A1 | 6/2006 | Watanabe | |
| 2009/0085435 | A1 | 4/2009 | Sekiguchi | |
| 2009/0096844 | A1 * | 4/2009 | Kojima et al. ................. | 347/72 |
| 2009/0244205 | A1 * | 10/2009 | Kura ................. | 347/68 |

FOREIGN PATENT DOCUMENTS

| | | |
|---|---|---|
| JP | 2002-127421 A | 5/2002 |
| JP | 2003-008091 A | 1/2003 |
| JP | 2005-039986 A | 2/2005 |
| JP | 2006-166529 A | 6/2006 |
| JP | 2006-168036 A | 6/2006 |
| JP | 2008-265353 A | 11/2008 |
| JP | 2009-083182 A | 4/2009 |

OTHER PUBLICATIONS

Japan Patent Office, Office Action for Japanese Patent Application No. 2008-334916 (counterpart to above-captioned patent application), mailed Jan. 18, 2011.

* cited by examiner

*Primary Examiner* — Lisa M Solomon
(74) *Attorney, Agent, or Firm* — Baker Botts L.L.P.

(57) ABSTRACT

A vibration plate, an insulating layer and a plurality of piezoelectric layers, connected to each other, are connected to an upper face of a flow passage unit. Between the plurality of piezoelectric layers, there is provided an intermediate electrode having: opposing portions opposed to center portions of pressure chambers; and connecting portions for connecting the opposing portions at a region opposed to connection portion with the flow passage unit. Between the insulating layer and one of the piezoelectric layers, there is provided a lower electrode extending across the entire region not opposed to the intermediate electrode, including regions opposed to regions of the pressure chambers located outside the center portions thereof. At an upper face of the other piezoelectric layer, upper electrodes are located to be opposed to the pressure chambers. A shielding electrode is arranged between the vibration plate and the insulating layer across the entire regions thereof.

10 Claims, 18 Drawing Sheets

SCANNING DIRECTION

PAPER FEED DIRECTION

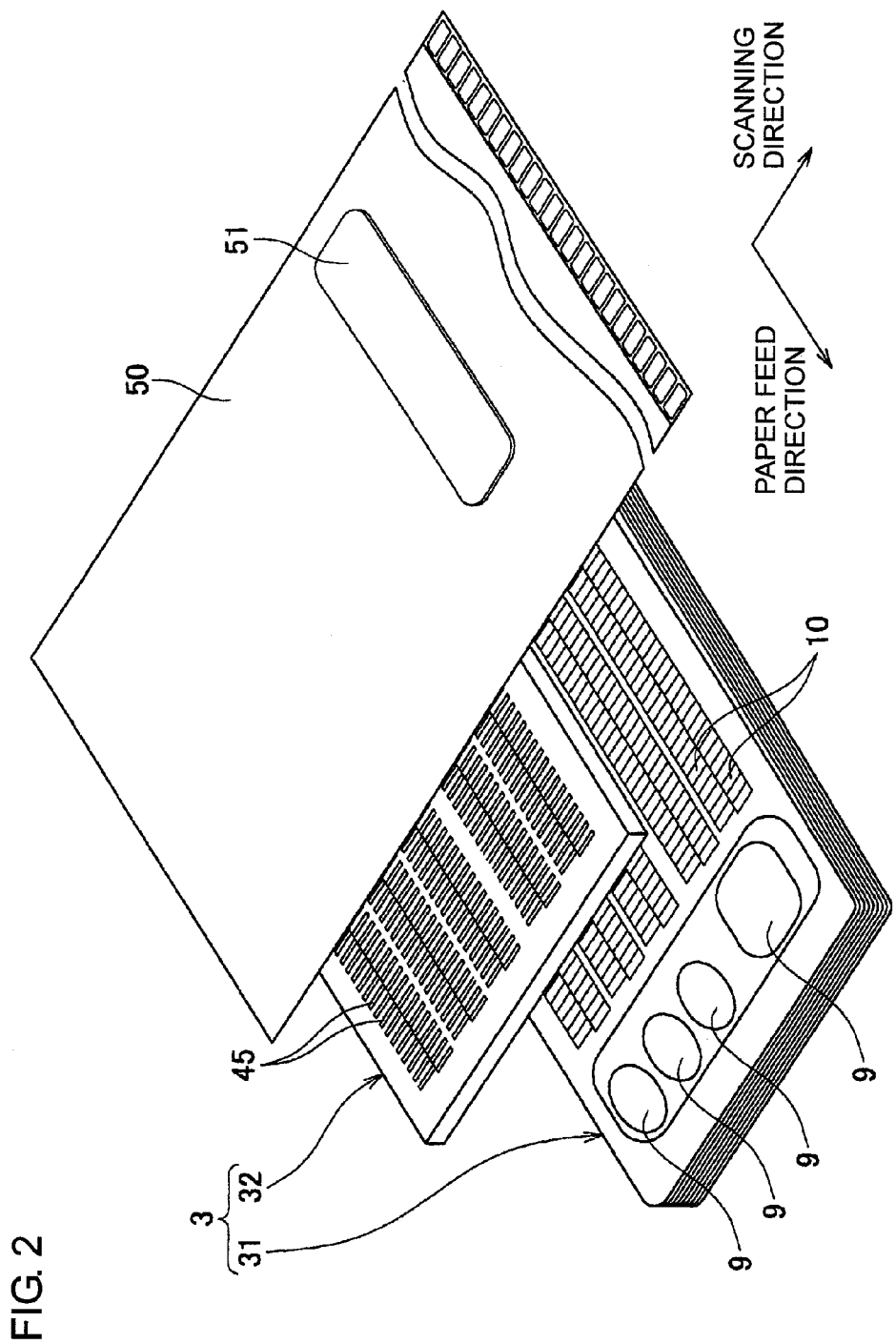

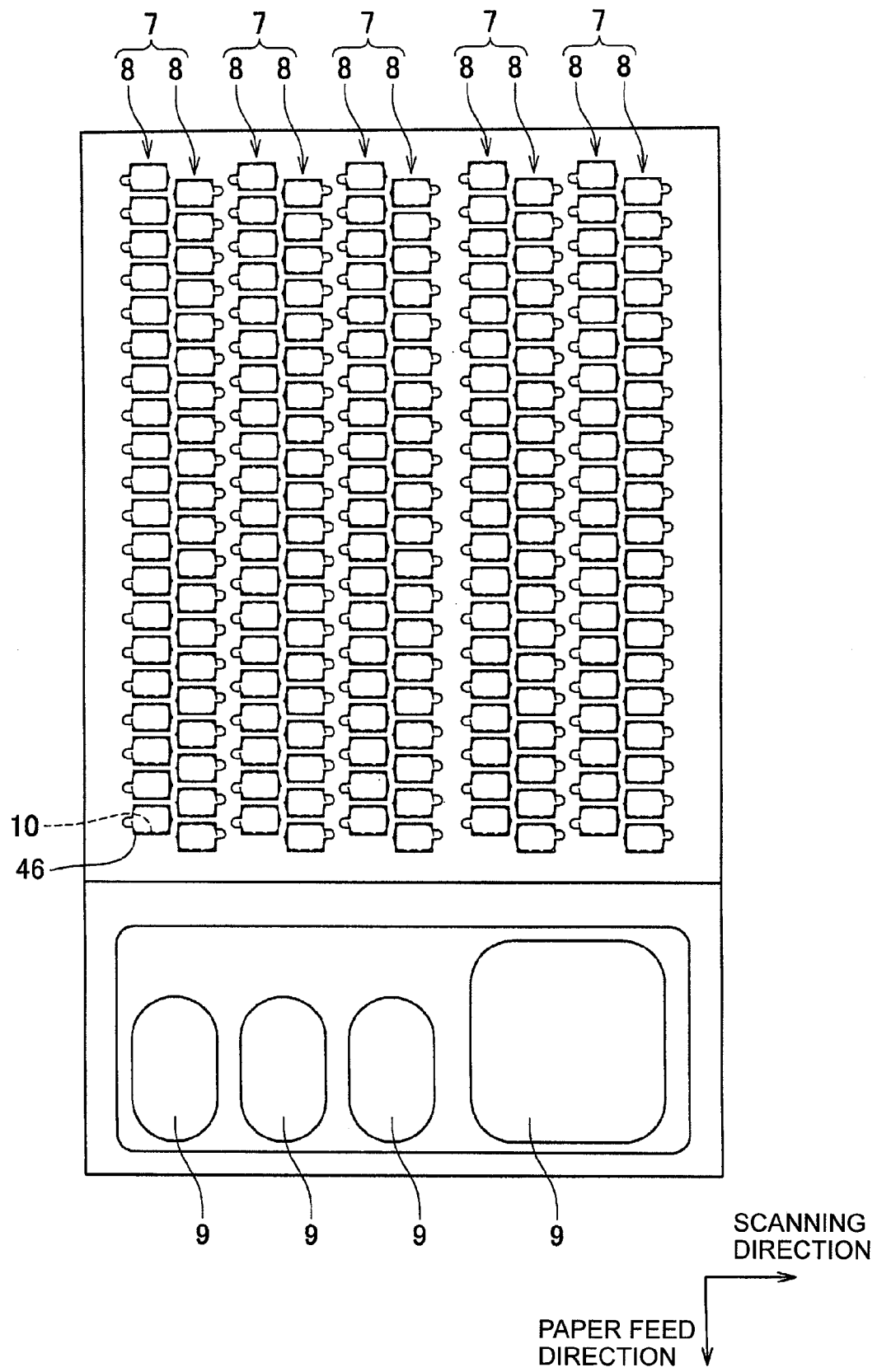

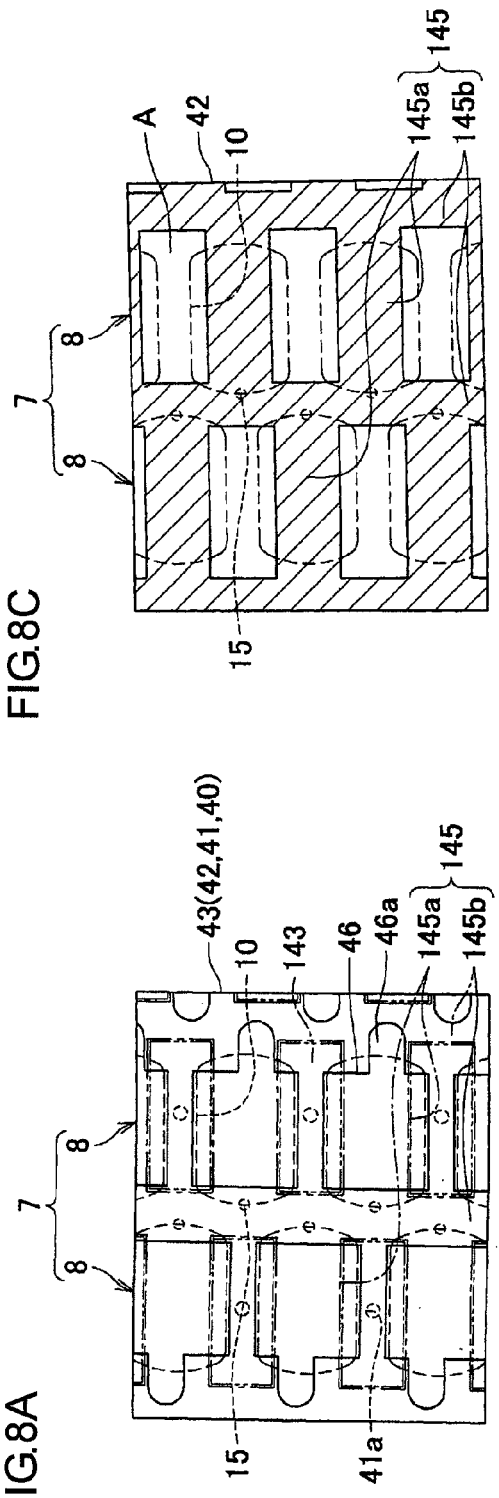
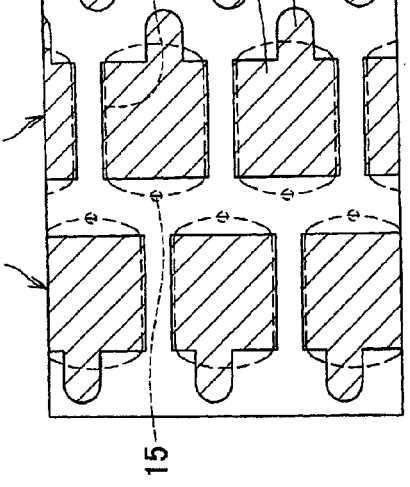
FIG.8A  FIG.8C
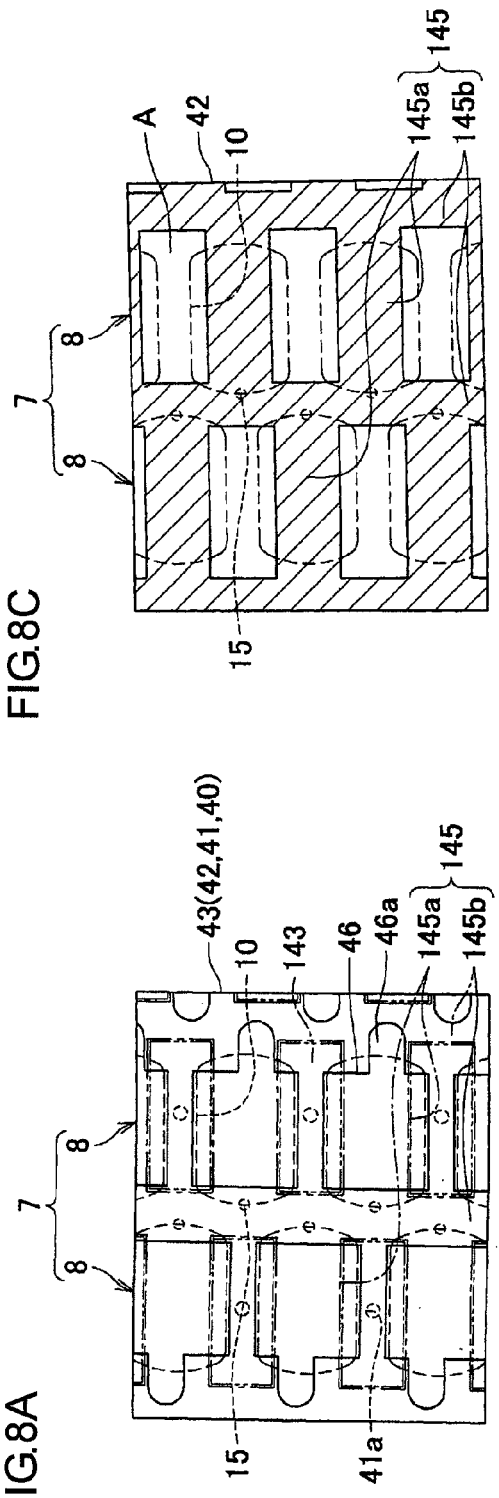
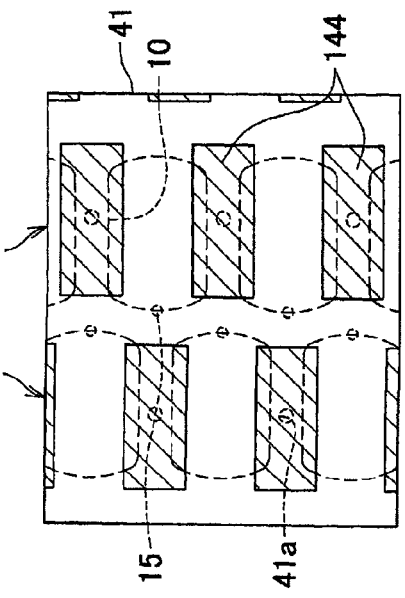
FIG.8B  FIG.8D

PIEZOELECTRIC ACTUATOR AND LIQUID TRANSFER DEVICE

CROSS-REFERENCE TO RELATED APPLICATIONS

This Nonprofessional application claims priority under 35 U.S.C. §119(a) on Patent Application No. 2008-334916 filed in Japan on Dec. 26, 2008, the entire contents of which are hereby incorporated by reference.

BACKGROUND

1. Technical Field

The present invention relates to a piezoelectric actuator driven by deforming a piezoelectric layer, and to a liquid transfer device having such a piezoelectric actuator.

2. Description of Related Art

In a liquid transfer device described in Japanese Patent Application Laid-Open No. 2008-265353, a piezoelectric actuator is arranged at an upper face of a flow passage unit, and the piezoelectric actuator has: a vibration plate that is located so as to cover a plurality of pressure chambers, and that also serves as a common electrode; a piezoelectric layer located at an upper face of the vibration plate; and a plurality of individual electrodes each formed on an upper face of the piezoelectric layer, which is opposed to the plurality of pressure chambers. A region of the piezoelectric layer, sandwiched between each individual electrode and the vibration plate serving as the common electrode, is polarized in the thickness direction of this region. Then, upon application of a driving potential to the individual electrodes, an electric field whose direction is equal to the polarization direction is generated in the region of the piezoelectric layer sandwiched between the individual electrodes and the vibration plate, thereby causing the sandwiched region of the piezoelectric layer to be horizontally shrunk. Thus, the regions of the vibration plate and the piezoelectric layer opposed to the pressure chambers are wholly deformed into a convex shape toward the pressure chambers (i.e., unimorph deformation is caused), and the volumetric capacities of the pressure chambers are reduced due to this deformation, thereby increasing the pressure of ink inside the pressure chambers and ejecting the ink from nozzles communicated with the pressure chambers.

SUMMARY

An object of the present invention is to provide: a piezoelectric actuator capable of preventing the generation of a large stress in a piezoelectric layer; and a liquid transfer device having such a piezoelectric actuator.

A piezoelectric actuator according to a first aspect is a piezoelectric actuator comprising: a vibration plate that is connected to an object at a predetermined connection portion, and that has a deformable portion at a region different from the connection portion; a first piezoelectric layer arranged at one face side of the vibration plate; a second piezoelectric layer arranged at one face of the first piezoelectric layer; and three types of drive electrodes arranged at respective faces of the first piezoelectric layer and the second piezoelectric layer said respective faces not being in contact with each other, so as to be opposed to at least the deformable portion, respectively, wherein the three types of the drive electrodes include: a first drive electrode maintained at a first potential; a second drive electrode maintained at a second potential different from the first potential; and a third drive electrode, which is opposed to the first drive electrode and the second drive electrode at a region opposed to the deformable portion, and to which either the first potential or the second potential is applied, and wherein the first piezoelectric layer and the second piezoelectric layer are not sandwiched between the first drive electrode and the second drive electrode at regions opposed to the connection portion.

If the first and second piezoelectric layers are sandwiched between the first drive electrode maintained at the first potential and the second drive electrode maintained at the second potential, the sandwiched regions of the first and second piezoelectric layers are brought to a state in which an electric field is generated, and are kept in a state in which these regions will deform due to this electric field. Therefore, when the sandwiched regions of the first and second piezoelectric layers are opposed to the connection portion of the vibration plate, the deformation of the first and second piezoelectric layers is prevented, and large stresses are generated in the sandwiched regions of the first and second piezoelectric layers. Furthermore, if such large stresses are generated in the first and second piezoelectric layers, cracks might be formed in the first and second piezoelectric layers.

However, in the first aspect, neither of the first and second piezoelectric layers is sandwiched between the first and second drive electrodes at regions opposed to the connection portion, thus preventing the generation of the above-described stresses in the regions of the first and second piezoelectric layers opposed to the connection portion.

It should be noted that a structure in which the first and second piezoelectric layers are sandwiched between the electrodes means a structure in which only the first and second piezoelectric layers are sandwiched between the electrodes, and does not include a structure in which another electrode is interposed between the electrodes sandwiching the first and second piezoelectric layers.

A liquid transfer device according to a second aspect is a liquid transfer device comprising: a flow passage unit in which a liquid transfer flow passage including a pressure chamber is formed; a piezoelectric actuator that changes a volumetric capacity of the pressure chamber, to apply pressure to liquid inside the pressure chamber; and a drive part for applying a driving voltage to the piezoelectric actuator, wherein the piezoelectric actuator comprises: a vibration plate connected to the flow passage unit at a connection portion other than a region opposed to the pressure chamber; a first piezoelectric layer arranged on a side of the vibration plate not facing toward the flow passage unit; a second piezoelectric layer arranged at a face of the first piezoelectric layer not facing toward the vibration plate; and first, second and third drive electrodes arranged at respective faces of the first piezoelectric layer and the second piezoelectric layer said respective faces not being in contact with each other, so as to be opposed to at least the pressure chamber, wherein the drive part applies a first potential to the first drive electrode, applies a second potential different from the first potential to the second drive electrode, and applies either the first potential or the second potential to the third drive electrode, wherein the first drive electrode is opposed to the connection portion and the pressure chamber, wherein the third drive electrode is arranged so as to be opposed to at least the pressure chamber, the first drive electrode and the second drive electrode, and wherein the first piezoelectric layer and the second piezoelectric layer are not sandwiched between the first drive electrode and the second drive electrode at regions opposed to the connection portion.

According to the first and second aspects, neither of the first and second piezoelectric layers is sandwiched between the first and second drive electrodes at regions opposed to the connection portion, thus preventing the generation of large stresses in the regions of the first and second piezoelectric layers opposed to the connection portion.

The above and further objects and features will more fully be apparent from the following detailed description with accompanying drawings.

BRIEF DESCRIPTION OF THE SEVERAL VIEWS OF THE DRAWINGS

FIG. 2 is an exploded perspective view of an ink jet head illustrated in FIG. 1;

FIG. 3 is a plan view of the ink jet head illustrated in FIG. 2;

FIGS. 8A to 8D are diagrams according to Variation 1, which are equivalent to FIGS. 4A to 4D;

DETAILED DESCRIPTION

Hereinafter, preferred embodiments of the present invention will be described.

Figure 1:
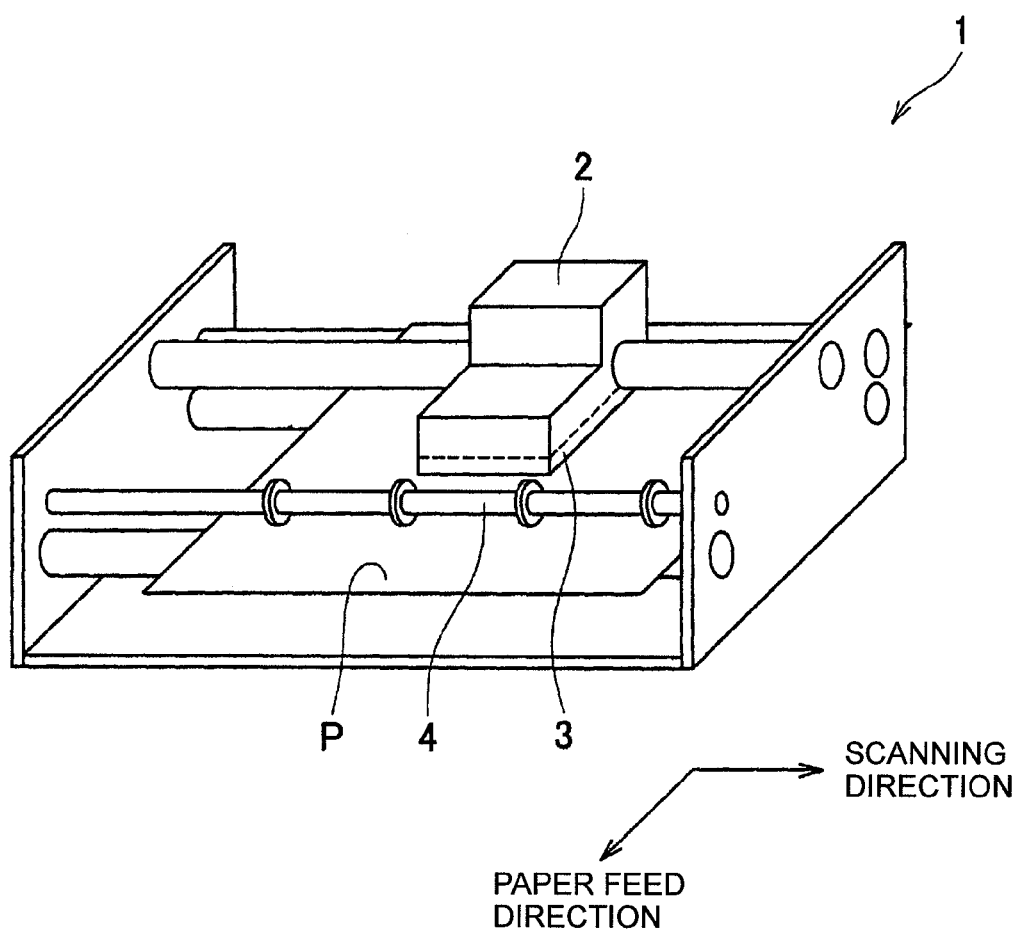
FIG. 1 is a diagram schematically illustrating a structure of a printer according to an embodiment of the present invention.

FIG. 1 is a diagram schematically illustrating a structure of a printer according to the present embodiment. As illustrated in FIG. 1, a printer 1 comprises a carriage 2, an ink jet head 3, a conveyance roller 4, and the like.

The carriage 2 reciprocates in a scanning direction (i.e., in the horizontal direction in FIG. 1). The ink jet head 3 (liquid transfer device) is attached to a lower face of the carriage 2, and ejects ink from nozzles 15 (see FIG. 5) formed at a lower face of the ink jet head 3. The conveyance roller 4 conveys a recording paper P in a paper feed direction (i.e., frontward in FIG. 1). Further, the printer 1 performs printing on the recording paper P by ejecting ink to the recording paper P from the nozzles 15 of the ink jet head 3 reciprocating in the scanning direction together with the carriage 2. Furthermore, the recording paper P, for which printing has been completed, is discharged in the paper feed direction by the conveyance roller 4.

Figure 4C:
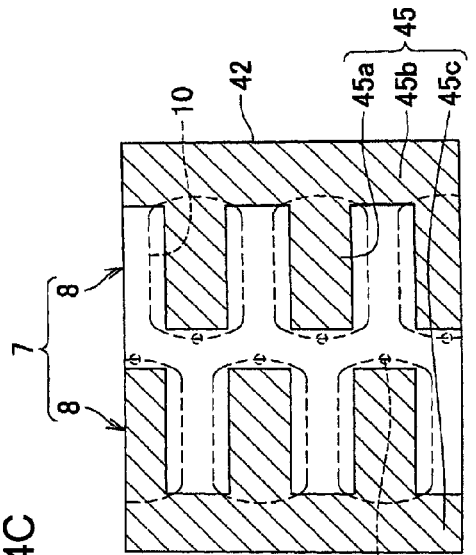
FIGS. 4B to 4D are diagrams illustrating surfaces of respective piezoelectric layers of FIG. 4A.
Figure 4D:
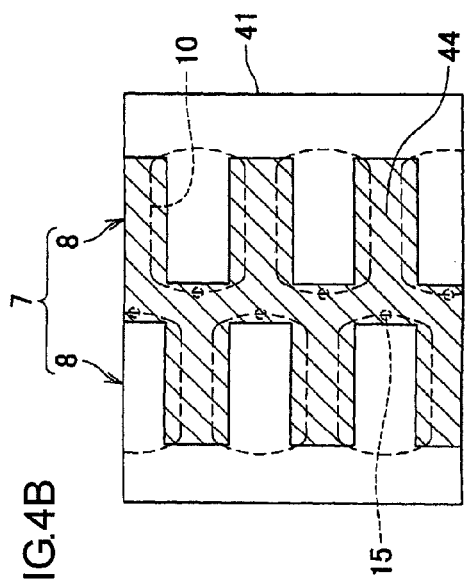
Figure 4A:
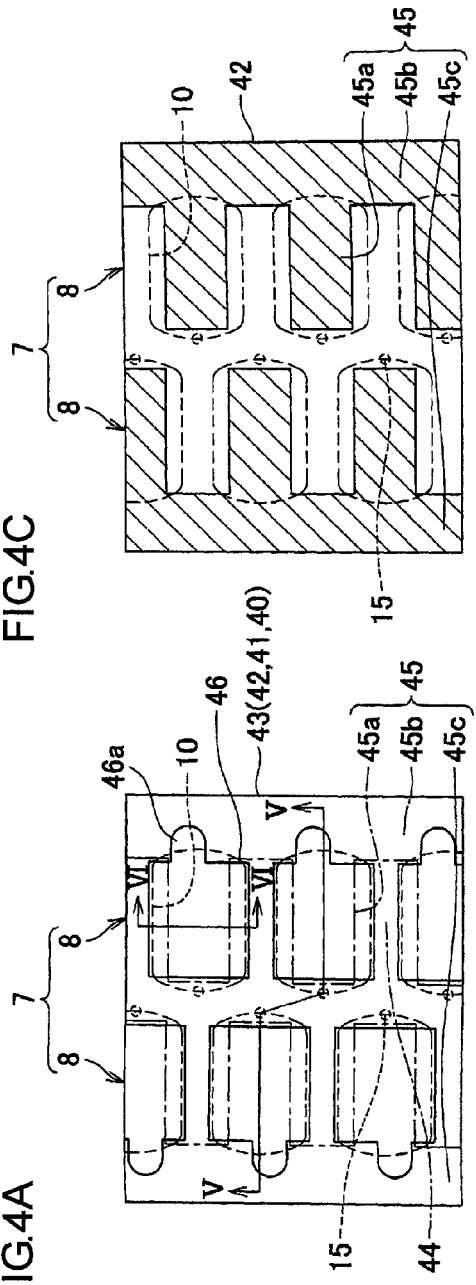
FIG. 4A is a partially enlarged view of FIG. 3.
Figure 4B:
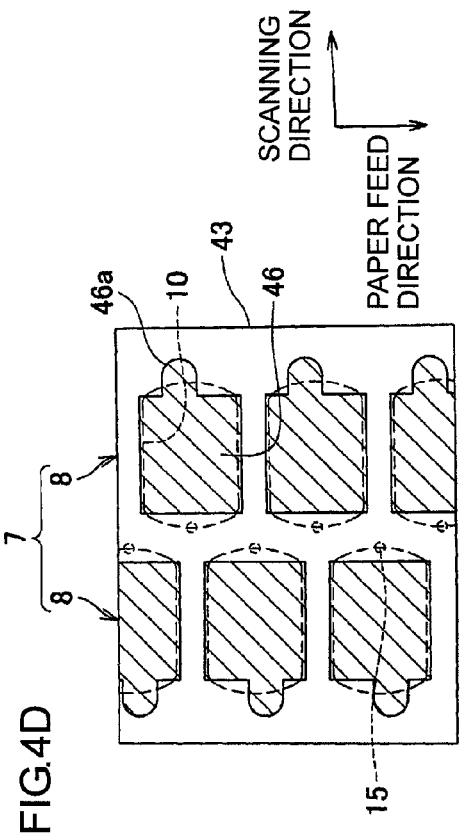
Figure 5:
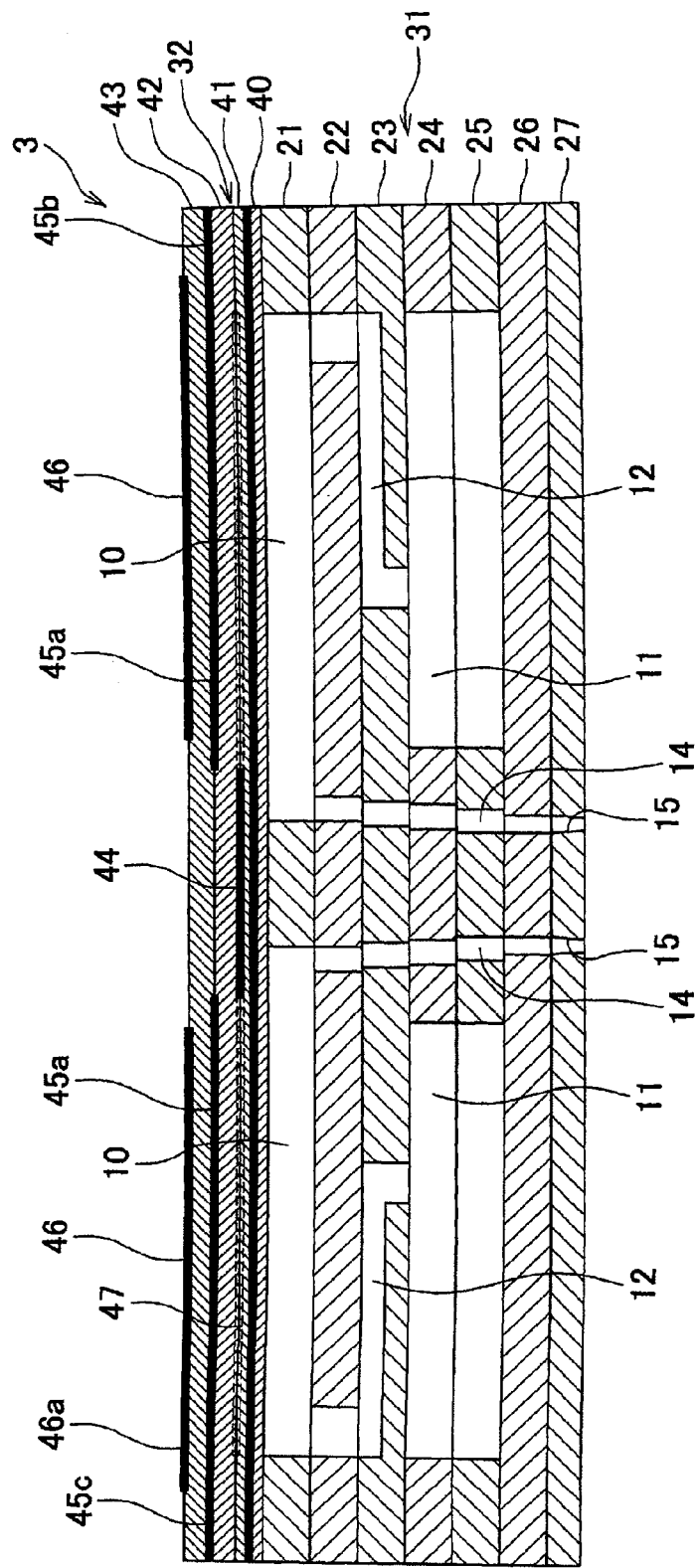
FIG. 5 is a cross-sectional view taken along a line V-V of FIG. 4A.
Figure 6:
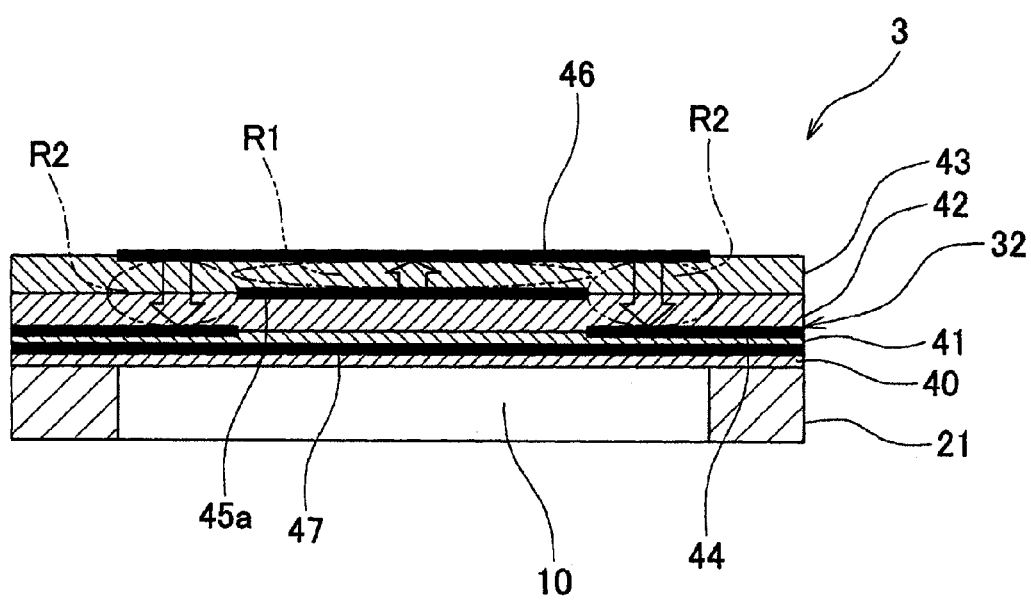
FIG. 6 is a cross-sectional view taken along a line VI-VI of FIG. 4A.

Next, the ink jet head 3 will be described in detail. FIG. 2 is an exploded perspective view of the ink jet head 3 illustrated in FIG. 1. FIG. 3 is a plan view of the ink jet head 3 illustrated in FIG. 2. FIG. 4A is a partially enlarged view of FIG. 3. FIGS. 4B to 4D are diagrams illustrating upper faces of piezoelectric layers 41 to 43 in FIG. 4A, respectively, which will be described later. FIG. 5 is a cross-sectional view taken along a line V-V of FIG. 4A. FIG. 6 is a cross-sectional view taken along a line VI-VI of FIG. 4A.

It should be noted that for the sake of clarification of the drawings, ink flow passages other than pressure chambers 10 and the nozzles 15 of a flow passage unit 31, which will be described later, are not illustrated in FIGS. 3 and 4A to 4D, and a lower electrode 44 and an intermediate electrode 45 of a piezoelectric actuator 32 are not illustrated in FIG. 3. Further, in FIG. 4A, the lower electrode 44 and the intermediate electrode 45, both of which should be indicated by dotted lines, are indicated by alternate long and short dash lines, respectively. Moreover, in FIGS. 4B to 4D, the lower electrode 44, intermediate electrode 45 and upper electrodes 46, which will be described later, are each hatched. In addition, in FIG. 6, a region of the flow passage unit 31, located below the pressure chamber 10, is not illustrated.

As illustrated in FIGS. 2 to 6, the ink jet head 3 includes the flow passage unit 31 and the piezoelectric actuator 32. In the flow passage unit 31, an ink flow passage (liquid transfer flow passage) including a plurality of individual ink flow passages is formed by stacking a plurality of plates 21 to 27. In the respective individual ink flow passages, ink supplied from ink supply ports 9 reaches manifold flow passages 11, reaches the pressure chambers 10 from outlets of the manifold flow passages 11 through aperture flow passages 12, and further reaches the nozzles 15 from the pressure chambers 10 through descender flow passages 14. Then, as described later, upon application of pressure to the ink inside the pressure chambers 10 by the piezoelectric actuator 32, the ink is ejected from the nozzles 15 communicated with the pressure chambers 10.

A plurality of the pressure chambers 10 each have an approximately elliptical planar shape with the scanning direction (the horizontal direction in FIG. 3) defined as its longitudinal direction. A single pressure chamber row 8 disposed in the paper feed direction (i.e., the vertical direction in FIG. 3) is arranged in two rows in the scanning direction, thereby allowing the plurality of pressure chambers 10 to constitute a single pressure chamber group 7. Moreover, the foregoing pressure chamber group 7 is arranged in five rows in the scanning direction. In this embodiment, the plurality of pressure chambers 10 constituting the single pressure chamber group 7 are arranged in two rows in a staggered arrangement. More specifically, with respect to the first pressure chamber row 8 in which the pressure chambers 10 are arranged at a predetermined arrangement pitch, the second pressure chamber row 8 is arranged at the predetermined arrangement pitch so as to be displaced from the first pressure chamber row 8 in the arrangement direction by half of the predetermined pitch. Further, the plurality of nozzles 15 are also arranged similarly to the plurality of pressure chambers 10.

Furthermore, among the five pressure chamber groups 7, black ink is ejected from the nozzles 15 associated with the pressure chambers 10 constituting the two pressure chamber groups 7 at the right-hand part of FIG. 3, while yellow ink, cyan ink and magenta ink are ejected from the nozzles 15 associated with the pressure chambers 10 constituting the three pressure chamber groups 7 at the left-hand part of FIG. 3 in the order presented from the right of FIG. 3. It should be noted that other regions of the ink flow passage are similar to those of a conventional ink flow passage, and therefore, the detailed description thereof will be omitted herein.

The piezoelectric actuator 32 includes a vibration plate 40, the piezoelectric layers 41 to 43, the lower electrode 44, the intermediate electrode 45, the upper electrodes 46 and a shielding electrode 47. The vibration plate 40 is made of a piezoelectric material consisting mainly of lead zirconate titanate that is mixed crystals of lead titanate and zirconate titanate. Further, the vibration plate 40 is arranged at an upper face of the flow passage unit 31 (object to be connected) so as to cover the plurality of pressure chambers 10, and is connected to the flow passage unit 31 at a region (connection portion) that is not opposed to the pressure chambers 10. On the other hand, regions (deformable portion) of the vibration plate 40, which are opposed to the pressure chambers 10, are not connected to the flow passage unit 31, and are thus deformable. Furthermore, the thickness of the vibration plate 40 is about 10 µm, for example. It should be noted that the vibration plate 40 does not necessarily have to be made of a piezoelectric material.

The piezoelectric layers 41 to 43 are each made of a piezoelectric material similar to that of the vibration plate 40, and are stacked so as to be arranged over an upper face of the vibration plate 40. Moreover, the thickness of the piezoelectric layer 41 is about 10 µm, for example, and the thickness of each of the piezoelectric layers 42 and 43 is about 20 µm, for example. It should be noted that the piezoelectric layers 42 and 43 are equivalent to first and second piezoelectric layers according to the present invention, respectively, and the piezoelectric layer 41 is equivalent to an insulating layer according to the present invention. Furthermore, the piezoelectric layer 41 does not necessarily have to be made of a piezoelectric material, but may alternatively be made of other materials having insulating properties.

The intermediate electrode 45 (second drive electrode) is arranged between the piezoelectric layers 42 and 43, and has a plurality of opposing portions 45$a$ and connecting portions 45$b$ and 45$c$ for each pressure chamber group 7. The plurality of opposing portions 45$a$ each have an approximately rectangular planar shape in which the length thereof in the paper feed direction is shorter than that of the pressure chamber 10, and are arranged so as to be opposed to approximate center portions (part of the deformable portion) of the plurality of pressure chambers 10 in the paper feed direction. Accordingly, the plurality of opposing portions 45$a$ are arranged in the paper feed direction (i.e., in predetermined one direction) similarly to the plurality of pressure chambers 10.

The connecting portion 45$b$ extends in the paper feed direction at a region located on the right side of the plurality of pressure chambers 10 constituting the pressure chamber row 8 arranged at the right-hand part of FIG. 4C among the two pressure chamber rows 8 constituting each pressure chamber group 7 (i.e., the connecting portion 45$b$ extends in the paper feed direction at a region opposed to the connection portion between the vibration plate 40 and the flow passage unit 31). Also, the connecting portion 45$b$ connects ends of the plurality of opposing portions 45$a$ at the right-hand part of FIG. 4C, which are associated with the plurality of pressure chambers 10 arranged on the right side.

The connecting portion 45$c$ extends in the paper feed direction at a region located on the left side of the plurality of pressure chambers 10 constituting the pressure chamber row 8 arranged at the left-hand part of FIG. 4C among the two pressure chamber rows 8 constituting each pressure chamber group 7 (i.e., the connecting portion 45$c$ extends in the paper feed direction at a region opposed to the connection portion between the vibration plate 40 and the flow passage unit 31). Also, the connecting portion 45$c$ connects ends of the plurality of opposing portions 45$a$ at the left-hand part of FIG. 4C, which are associated with the plurality of pressure chambers 10 arranged on the left side. Furthermore, the intermediate electrode 45 is connected to a driver IC 51 via a flexible printed circuit (FPC) 50 located above the piezoelectric actuator 32, and is constantly maintained at a predetermined potential (at a second potential that is about 20 V, for example) by the driver IC 51.

The lower electrode 44 (first drive electrode) is formed between the piezoelectric layers 41 and 42 (i.e., at a face of the piezoelectric layer 42 facing toward the vibration plate 40), and is extended across the entire region that is not opposed to the intermediate electrode 45. Accordingly, the lower electrode 44 is opposed to regions of the pressure chambers 10 located outside the regions of the pressure chambers 10 opposed to the intermediate electrode 45 (i.e., the opposing portions 45$a$); in other words, the lower electrode 44 is opposed to regions of the pressure chambers 10 different from regions of the pressure chambers 10 opposed to the intermediate electrode 45.

Further, the lower electrode 44 is connected to the driver IC 51 via the FPC 50, and is constantly maintained at a ground potential (first potential) by the driver IC 51.

The plurality of upper electrodes 46 (third drive electrodes) are arranged at an upper face of the piezoelectric layer 43 (i.e., at a face thereof not facing toward the piezoelectric layer 42) so as to be opposed to the approximately entire regions of the plurality of pressure chambers 10 in association with the plurality of pressure chambers 10. Also, the plurality of upper electrodes 46 each have an approximately rectangular planar shape in which the length thereof in the paper feed direction is longer than that of the opposing portion 45$a$ of the intermediate electrode 45. Further, parts of the upper electrodes 46 located at ends thereof opposite to the nozzles 15 in the scanning direction are extended to the regions that are not opposed to the pressure chambers 10 in the scanning direction, and these parts serve as connecting terminals 46$a$ to be connected to the FPC 50. Furthermore, the upper electrodes 46 are connected to the driver IC 51 via the FPC 50, and either the ground potential (first potential) or the predetermined potential (second potential that is 20 V, for example) is selectively applied to the upper electrodes 46.

It should be noted that in the present embodiment, the lower electrode 44, the intermediate electrode 45 and the upper electrodes 46 are equivalent to three types of drive electrodes according to the present invention, and the three types of the electrodes 44 to 46 are arranged at different faces of the piezoelectric layers 42 and 43.

The shielding electrode 47 is arranged between the vibration plate 40 and the piezoelectric layer 41 (i.e., at a face of the piezoelectric layer 41 not facing toward the piezoelectric layer 42), and is extended across the entire regions of the vibration plate 40 and the piezoelectric layer 41. Further, the shielding electrode 47 is connected to the driver IC 51 via the FPC 50, and is constantly maintained at the ground potential.

Furthermore, since the lower electrode 44, the intermediate electrode 45, the upper electrodes 46 and the shielding electrode 47 are arranged in this manner, regions (active portions R1) of the piezoelectric layer 43, opposed to the approximate center portions of the pressure chambers 10 are sandwiched between the upper electrodes 46 and the intermediate electrode 45. The active portions R1 are each polarized upward toward the upper electrode 46 from the intermediate electrode 45. It should be noted that in the present embodiment, the description of the piezoelectric layer sandwiched between the electrodes means that only the piezoelectric layer is sandwiched between the electrodes, and does not include a structure in which another electrode is interposed between the electrodes.

Moreover, at regions (active portions R2) of the piezoelectric layers 42 and 43 opposed to the pressure chambers 10 except the regions of the piezoelectric layers 42 and 43 opposed to the intermediate electrode 45, the upper electrodes 46 and the lower electrode 44 are opposed to each other with no intermediate electrode 45 interposed therebetween. Accordingly, the active portions R2 of the piezoelectric layers 42 and 43 are sandwiched between the upper electrodes 46 and the lower electrode 44. Further, the active portions R2 are polarized downward toward the lower electrode 44 from the upper electrodes 46.

Furthermore, the piezoelectric layer 42 is not sandwiched between the lower electrode 44 and the intermediate electrode 45 at any of the regions of the piezoelectric layer 42 opposed to the pressure chambers 10 and a region of the piezoelectric layer 42, which is not opposed to the pressure chambers 10 but opposed to the connection portion between the vibration plate 40 and the flow passage unit 31. It should be noted that the piezoelectric layer 43 is arranged above both of the lower electrode 44 and the intermediate electrode 45, and therefore the piezoelectric layer 43 is not sandwiched between the lower electrode 44 and the intermediate electrode 45.

Here, if the region of the piezoelectric layer 42, opposed to the connection portion between the vibration plate 40 and the flow passage unit 31, is sandwiched between the lower electrode 44 and the intermediate electrode 45 unlike the present embodiment, an electric field is generated in the region of the piezoelectric layer 42, sandwiched between these electrodes, in the thickness direction of this region due to the potential difference between the lower electrode 44 maintained at the ground potential and the intermediate electrode 45 maintained at the predetermined potential. Since the direction of this electric field is equal to the polarization direction in the region of the piezoelectric layer 42 opposed to the connection portion, the piezoelectric layer 42 will shrink in the horizontal direction perpendicular to the direction of this electric field.

Furthermore, in the ink jet head 3, the region (connection portion) of the vibration plate 40, which is not opposed to the pressure chambers 10, is connected to the flow passage unit 31 (cavity plate 21), and the piezoelectric layers 41 to 43 are stacked over the upper face of the vibration plate 40.

Therefore, the shrinkage of the above-described piezoelectric layer 42 is prevented; as a result, large stresses might be generated in the regions of the vibration plate 40 and the piezoelectric layers 41 to 43, which are opposed to the connection portion, and cracks might be formed in the vibration plate 40 and the piezoelectric layers 41 to 43. Further, when cracks are formed in the vibration plate 40 and the piezoelectric layers 41 to 43, there occur problems that a short circuit is caused between the electrodes via the cracks, and the dielectric strength of the piezoelectric layers 41 to 43 is degraded, for example.

On the other hand, in the present embodiment, the piezoelectric layer 42 is not sandwiched between the lower electrode 44 and the intermediate electrode 45 as described above, thus avoiding the generation of the above-mentioned large stresses in the vibration plate 40 and the piezoelectric layers 41 to 43, and preventing the formation of cracks in the vibration plate 40 and the piezoelectric layers 41 to 43.

Moreover, the lower electrode 44 and the intermediate electrode 45 are not opposed to each other; therefore, if the shielding electrode 47 is not provided unlike the present embodiment, the potential of the flow passage unit 31 might be changed due to the potential of the intermediate electrode 45 that is maintained at the predetermined potential. Furthermore, when unnecessary electric charge is accumulated in the flow passage unit 31 due to the change in the potential of the flow passage unit 31 and the piezoelectric actuator 32 is driven as described below by this electric charge, some adverse effects might be exerted on the flow passage unit 31 such as changes in ejection properties of ink from the nozzles 15.

On the other hand, in the present embodiment, the piezoelectric layer 41 serving as an insulating layer is arranged at a lower face of the piezoelectric layer 42, and the shielding electrode 47 maintained at the ground potential is arranged at a lower face of the piezoelectric layer 41; therefore, the shielding electrode 47 is interposed between the intermediate electrode 45 and the flow passage unit 31, and the flow passage unit 31 is maintained at the ground potential. Thus, the occurrence of some adverse effects on the flow passage unit 31 due to the potential of the intermediate electrode 45 can be prevented.

Moreover, since the shielding electrode 47 is extended across the entire lower face of the piezoelectric layer 41, the flow passage unit 31 is maintained at the ground potential with reliability. Thus, the occurrence of some adverse effects on the flow passage unit 31 due to the potential of the intermediate electrode 45 can be prevented with reliability.

It should be noted that since the intermediate electrode 45 is maintained at the predetermined potential while the shielding electrode 47 is maintained at the ground potential, an electric field is generated in the regions of the piezoelectric layers 41 and 42, sandwiched between the intermediate electrode 45 and the shielding electrode 47, in the thickness direction of these regions due to the potential difference between these electrodes, and stresses are generated in the regions of the vibration plate 40 and the piezoelectric layers 41 to 43 opposed to the connection portion as described above. However, the distance (about 30 μm) between the intermediate electrode 45 and the shielding electrode 47 in the direction in which the vibration plate 40 and the piezoelectric layers 41 to 43 are stacked is greater than the distance (about 20 μm) between the intermediate electrode 45 and the lower electrode 44 by the thickness of the piezoelectric layer 41. Therefore, the electric field generated in the piezoelectric layers 41 and 42 is small as compared with the electric field generated in the piezoelectric layer 42 when the lower electrode 44 and the intermediate electrode 45 are opposed to each other. Accordingly, the stresses generated in the vibration plate 40 and the piezoelectric layers 41 to 43 are also small.

Further, when the flow passage unit 31 and the piezoelectric actuator 32 are connected to each other, a minute foreign substance might enter between the flow passage unit 31 and the vibration plate 40, and cracks might be formed in the vibration plate 40 and the piezoelectric layers 41 to 43 due to this foreign substance, thereby degrading the dielectric strength of the vibration plate 40 and the piezoelectric layers 41 to 43. However, even in such a case, significant degradation in the dielectric strength is prevented because the dielectric strength is increased by the dielectric strength of the piezoelectric layer 41 as compared with the case where no piezoelectric layer 41 is provided in the piezoelectric actuator 32.

Figure 7:
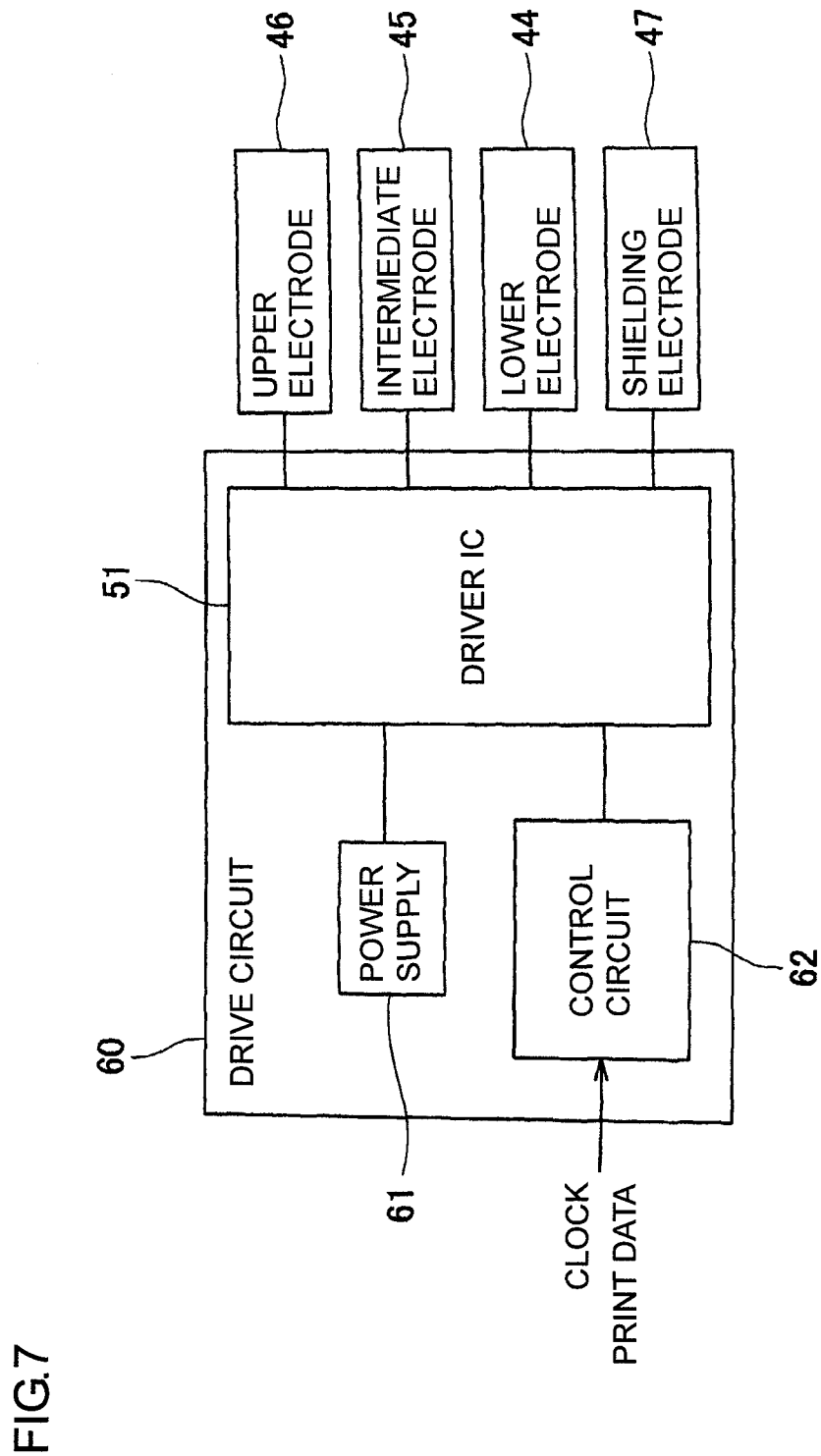
FIG. 7 is a block diagram illustrating a configuration of a drive circuit including a driver IC.
Figure 9:
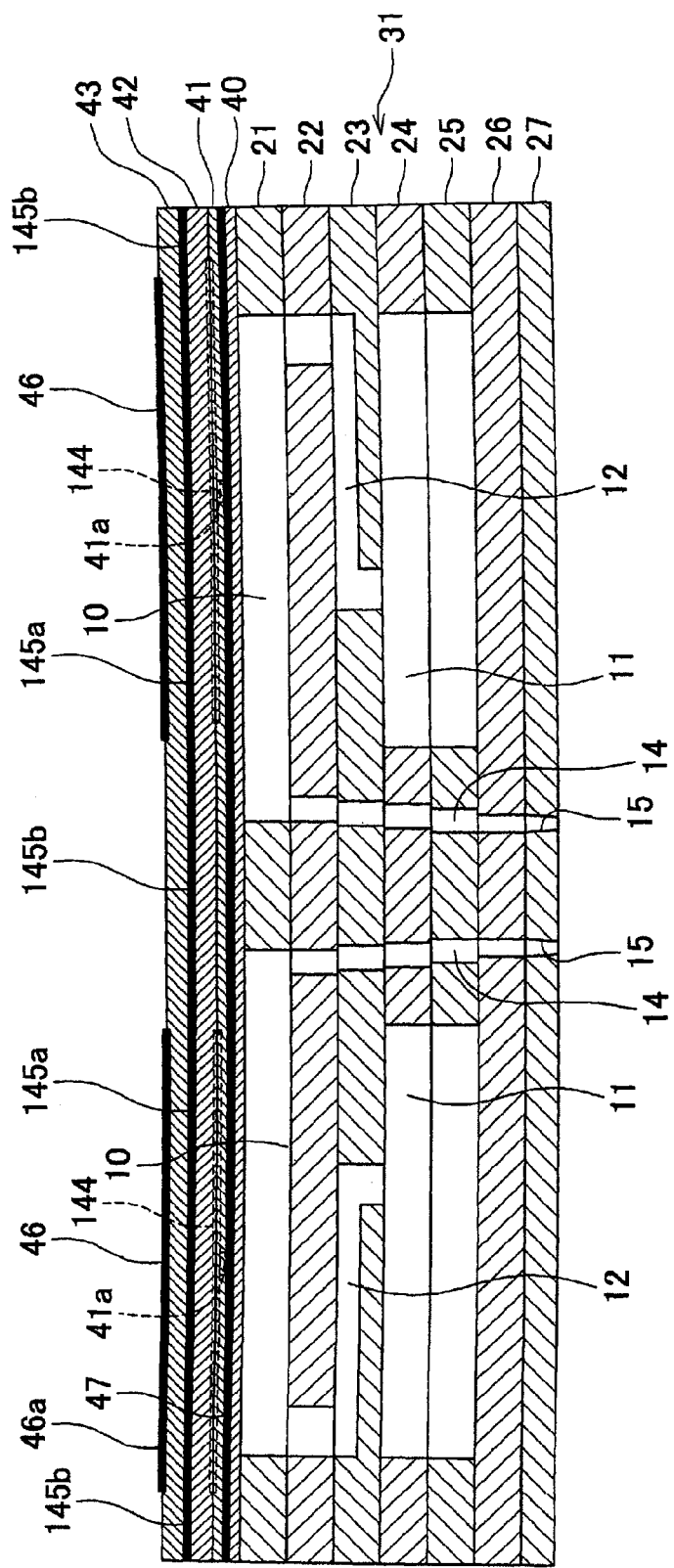
FIG. 9 is a diagram according to Variation 1, which is equivalent to FIG. 5.

Next, a drive circuit (drive means) including the driver IC 51 for applying potentials to the electrodes 44 to 47 will be described. FIG. 7 is a block diagram illustrating a configuration of the drive circuit including the driver IC 51. As illustrated in FIG. 7, the drive circuit 60 is configured by the driver IC 51 connected to a power supply 61 and a control circuit 62.

The power supply 61 is arranged outside the ink jet head 3 in the printer 1, and is connected to the driver IC 51 via the FPC 50. The power supply 61 supplies, to the driver IC 51, electric power necessary for application of potentials to the electrodes 44 to 47. The control circuit 62 is connected to the driver IC 51 via the FPC 50, and outputs, to the driver IC 51, a driving signal for driving the piezoelectric actuator 32 in accordance with clock, print data, etc. inputted from outside. Further, the electric power is supplied from the power supply 61 to the driver IC 51, the driving signal is inputted from the control circuit 62 to the driver IC 51, and the driver IC 51 applies potentials to the electrodes 44 to 47 as described above (i.e., applies a driving voltage to the piezoelectric actuator 32).

Next, operations of the piezoelectric actuator 32 will be described. First, in a standby state before the piezoelectric actuator 32 ejects ink, the lower electrode 44 and the intermediate electrode 45 are constantly maintained at the ground potential and the predetermined potential (e.g., 20 V), respectively, and the potentials of the upper electrodes 46 are each maintained at the ground potential in advance as described above. In this state, the potential of each upper electrode 46 is lower than that of the intermediate electrode 45, and is similar to that of the lower electrode 44.

Thus, a potential difference is caused between each upper electrode 46 and the intermediate electrode 45, and an upward electric field whose direction is equal to the polarization direction is generated in the active portions R1. Hence, the active portions R1 are shrunk in the horizontal direction perpendicular to the direction of this electric field. Consequently, so-called "unimorph deformation" occurs, thereby causing the regions (deformable portion) of the piezoelectric layer 42, the piezoelectric layer 41 and the vibration plate 40, which are opposed to the pressure chambers 10, to be wholly deformed into a convex shape toward the pressure chambers 10. In this state, the volumetric capacities of the pressure chambers 10 are small as compared with the case where the piezoelectric layers 41 to 43 and the vibration plate 40 are not deformed.

Furthermore, when the piezoelectric actuator 32 is driven with the aim of ejecting ink, the potential of each upper electrode 46 is temporarily switched to the predetermined potential, and is returned to the ground potential after a lapse of a predetermined period of time. Upon switching of the potential of each upper electrode 46 to the predetermined potential, the potential of each upper electrode 46 becomes equal to that of the intermediate electrode 45, and becomes higher than that of the lower electrode 44. Thus, the active portions R1 are each restored to its original state from the above-described shrinkage. Furthermore, concurrently with the restoration from the shrinkage, a potential difference is caused between each upper electrode 46 and the lower electrode 44, and a downward electric field whose direction is equal to the polarization direction is generated in the active portions R2, thereby causing the active portions R2 to be horizontally shrunk. Consequently, the piezoelectric layers 41 to 43 and the vibration plate 40 are wholly deformed into a convex shape toward the side not facing toward the pressure chambers 10, and the volumetric capacities of the pressure chambers 10 are increased.

Thereafter, upon retuning of the potential of each upper electrode 46 to the ground potential, the regions of the piezoelectric layers 41 to 43 and the vibration plate 40, which are opposed to the pressure chambers 10, are wholly deformed into a convex shape toward the pressure chambers 10 and the volumetric capacities of the pressure chambers 10 are reduced as described above. Thus, the pressure of ink inside the pressure chambers 10 is increased (i.e., pressure is applied to ink inside the pressure chambers 10), thereby ejecting ink from the nozzles 15 communicated with the pressure chambers 10.

Further, upon switching of the potential of each upper electrode 46 from the ground potential to the predetermined potential when the piezoelectric actuator 32 is driven as described above, the active portions R1 are extended from the shrunk state to the pre-shrunk state, while the active portions R2 are shrunk; thus, the extension of the active portions R1 is partially absorbed by the shrinkage of the active portions R2. On the other hand, when the potential of each upper electrode 46 is returned to the ground potential from the predetermined potential, the active portions R1 are shrunk, while the active portions R2 are extended to the pre-shrunk state, and therefore the shrinkage of the active portions R1 is partially absorbed by the extension of the active portions R2.

The above-described features suppress so-called "crosstalk" in which the deformation of the regions of the piezoelectric layers 42 and 43, which are opposed to the pressure chambers 10, is transmitted to regions opposed to the other pressure chambers 10, thus causing changes in the ejection properties of ink from the nozzles 15 communicated with said other pressure chambers 10.

In this case, unlike the present embodiment, if the lower electrode 44 is extended to the regions opposed to the approximate center portions of the pressure chambers 10 and the regions of the piezoelectric layer 42 opposed to the approximate center portions of the pressure chambers 10 are sandwiched between the lower electrode 44 and the intermediate electrode 45, said regions of the piezoelectric layer 42 are polarized downward toward the lower electrode 44 from the intermediate electrode 45 when the active portions R1 and R2 are polarized. Then, when the piezoelectric actuator 32 is in the foregoing standby state and when the piezoelectric actuator 32 is driven, an electric field whose direction is equal to the polarization direction is generated in said regions of the piezoelectric layer 42 due to the potential difference between the lower electrode 44 maintained at the ground potential and the intermediate electrode 45 maintained at the predetermined potential. Therefore, said regions of the piezoelectric layer 42 are kept in the shrunk state due to this electric field. As a result, when the piezoelectric actuator 32 is driven as described above, the deformation of the vibration plate 40 and the piezoelectric layers 41 to 43 might be hindered due to the shrunk piezoelectric layer 42.

However, in the present embodiment, the regions of the piezoelectric layer 42 opposed to the pressure chambers 10 are not sandwiched between the lower electrode 44 and the intermediate electrode 45; therefore, the above-described shrinkage of the piezoelectric layer 42 does not occur, and the deformation of the vibration plate 40 and the piezoelectric layers 41 to 43 is not hindered.

According to the present embodiment described thus far, the piezoelectric layer 42 is not sandwiched between the lower electrode 44 and the intermediate electrode 45, and therefore, the shrinkage caused by the potential difference between the lower electrode 44 and the intermediate electrode 45 does not occur in the region of the piezoelectric layer 42 opposed to the connection portion between the flow passage unit 31 and the vibration plate 40. Accordingly, the above-described large stresses are not generated in the vibration plate 40 and the piezoelectric layers 41 to 43, and cracks can be prevented from being formed in the vibration plate 40 and the piezoelectric layers 41 to 43.

Moreover, although the lower electrode 44 and the intermediate electrode 45 are not opposed to each other, the piezoelectric layer 41 serving as an insulating layer is arranged at the lower face of the piezoelectric layer 42, and the shielding electrode 47 maintained at the ground potential is arranged at the lower face of the piezoelectric layer 41. Therefore, the shielding electrode 47 is interposed between the intermediate electrode 45 and the flow passage unit 31, thereby maintaining the flow passage unit 31 at the ground potential. Thus, the occurrence of some adverse effects on the flow passage unit 31 due to the potential of the intermediate electrode 45 can be prevented.

It should be noted that an electric field is generated in the regions of the piezoelectric layers 41 and 42, sandwiched between the intermediate electrode 45 and the shielding electrode 47, in the thickness direction of these regions, due to the potential difference between these electrodes, and stresses are generated in the regions of the vibration plate 40 and the piezoelectric layers 41 to 43 opposed to these sandwiched regions as described above. However, the distance between the intermediate electrode 45 and the shielding electrode 47 in the direction in which the vibration plate 40 and the piezoelectric layers 41 to 43 are stacked is greater than the distance between the intermediate electrode 45 and the lower electrode 44 by the thickness of the piezoelectric layer 41. Therefore, the electric field generated in the piezoelectric layers 41 and 42 is small as compared with the electric field generated in the piezoelectric layer 42 when the lower electrode 44 and the intermediate electrode 45 are opposed to each other. Thus, the stresses generated in the vibration plate 40 and the piezoelectric layers 41 to 43 are also small.

Further, when the flow passage unit 31 and the piezoelectric actuator 32 are connected to each other, a minute foreign substance might enter between the flow passage unit 31 and the vibration plate 40, and cracks might be formed in the vibration plate 40 and the piezoelectric layers 41 to 43 due to this foreign substance, thereby degrading the dielectric strength of the vibration plate 40 and the piezoelectric layers 41 to 43. However, significant degradation in the dielectric strength is prevented because the dielectric strength is increased by the dielectric strength of the piezoelectric layer 41 as compared with the case where no piezoelectric layer 41 is provided in the piezoelectric actuator 32.

Furthermore, since the regions of the piezoelectric layer 42 opposed to the pressure chambers 10 are not sandwiched between the lower electrode 44 and the intermediate electrode 45, the regions of the piezoelectric layer 42 other than the active portions R1 and R2 are not shrunk, thus eliminating the possibility that the deformation of the vibration plate 40 and the piezoelectric layers 41 to 43 might be hindered.

Next, variations in which various modifications are made to the present embodiment will be described. It is to be noted that similar components as those in the present embodiment are identified by the same reference symbols, and the description thereof will be omitted when deemed appropriate.

(Variation 1)

The structure of the piezoelectric actuator is not limited to that of the present embodiment. In Variation 1, as illustrated in FIGS. 8A to 8D and 9, lower electrodes 144 and an intermediate electrode 145 are provided instead of the lower electrode 44 and the intermediate electrode 45 (see FIGS. 4B and 4C) of the present embodiment, respectively.

The intermediate electrode 145 is arranged between the piezoelectric layers 42 and 43. Further, the intermediate electrode 145 has a plurality of opposing portions 145a, which are arranged in the paper feed direction (i.e., in the vertical direction in FIGS. 8A to 8D, or in predetermined one direction), so as to be opposed to the plurality of pressure chambers 10, similarly to the opposing portions 45a (see FIG. 4C). The intermediate electrode 145 further has connecting portions 145b that extend in the paper feed direction at the regions located between the respective pressure chamber rows 8 and opposed to the connection portion between the vibration plate 40 and the flow passage unit 31, and that connect both ends of the plurality of opposing portions 145a in the scanning direction (i.e., the direction perpendicular to the predetermined one direction), associated with the plurality of pressure chambers 10 constituting the adjacent pressure chamber rows 8.

The lower electrodes 144 are each arranged at an area positioned between the piezoelectric layers 41 and 42 and opposed to an associated one of a plurality of areas A that are surrounded by the opposing portions 145a and the connecting portions 145b in plan view and not continuous with each other. Thus, the lower electrodes 144 are opposed to regions of the pressure chambers 10, located outside the approximate center portions thereof opposed to the intermediate electrode 145, but are not opposed to the intermediate electrode 145 at any of the regions thereof opposed to the pressure chambers 10 (i.e., the region thereof opposed to the deformable portion) and the region thereof opposed to the connection portion between the vibration plate 40 and the flow passage unit 31.

Moreover, at regions of the piezoelectric layer 41 opposed to the approximate center portions of the respective lower electrodes 144, through holes 41a passing through the piezoelectric layer 41 in its thickness direction are formed, and the lower electrodes 144 and the shielding electrode 47 are brought into conduction via the through holes 41a.

Also in Variation 1, the region of the piezoelectric layer 42, which is opposed to the connection portion between the vibration plate 40 and the flow passage unit 31, is not sandwiched between the intermediate electrode 145 and the lower electrodes 144. Therefore, similarly to the present embodiment, large stresses will not be generated in the regions of the vibration plate 40 and the piezoelectric layers 41 to 43, which are opposed to the connection portion, and cracks can be prevented from being formed in the vibration plate 40 and the piezoelectric layers 41 to 43.

Further, since the regions of the piezoelectric layer 42 opposed to the approximate center portions of the pressure chambers 10 are not kept in the shrunk state, the deformation of the vibration plate 40 and the piezoelectric layers 41 to 43 is not hindered by the shrinkage of said regions of the piezoelectric layer 42 when the piezoelectric actuator 32 is driven.

Furthermore, in Variation 1, the lower electrodes 144 are arranged so as to be opposed to the plurality of areas that are located between the piezoelectric layers 41 and 42 and that are not continuous with each other, respectively. However, since the lower electrodes 144 are each brought into conduction with the shielding electrode 47 via the through holes 41a, the plurality of lower electrodes 144, each located at the associated one of the plurality of areas that are not continuous with each other, can be easily maintained at the ground potential by maintaining the shielding electrode 47 at the ground potential.

(Variation 2)

In the present embodiment, the intermediate electrode 45 and the lower electrode 44 are arranged so as not to be opposed to each other not only at the regions of the vibration plate 40 and the piezoelectric layers 41 to 43, which are opposed to the connection portion between the vibration plate 40 and the flow passage unit 31, but also at the regions of the vibration plate 40 and the piezoelectric layers 41 to 43, which are opposed to the pressure chambers 10; however, the present invention is not limited to this structure.

Figure 10A:
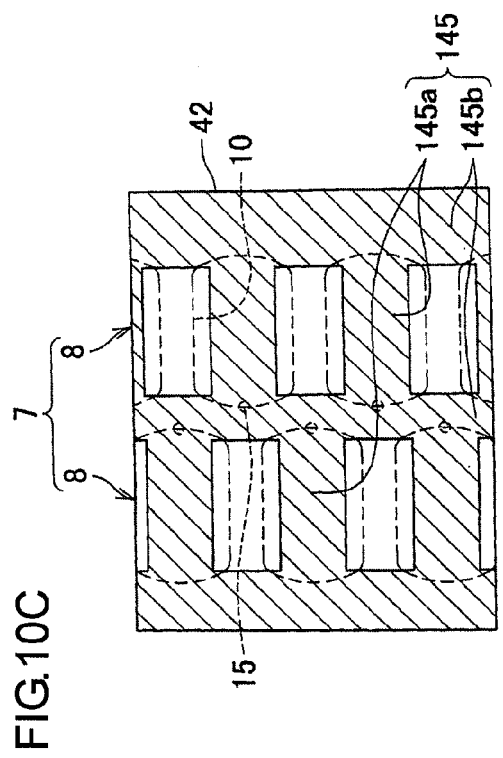
FIGS. 10A to 10D are diagrams according to Variation 2, which are equivalent to FIGS. 4A to 4D.
Figure 10C:
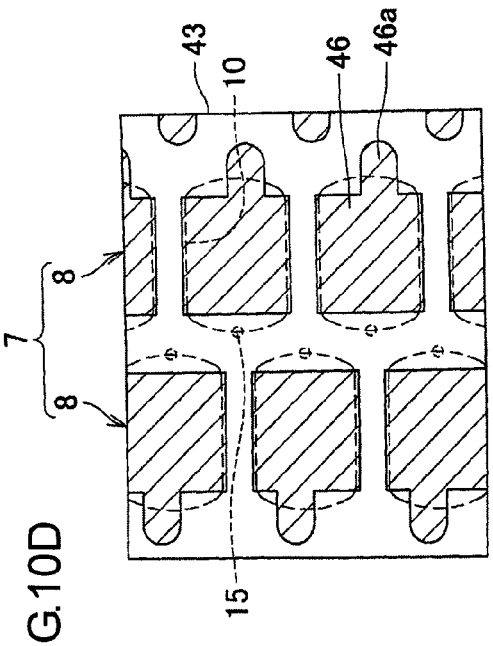
Figure 10B:
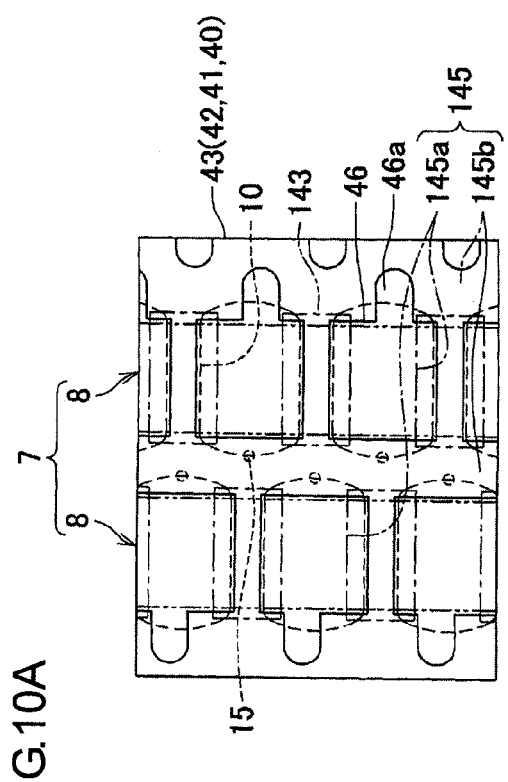
Figure 10D:
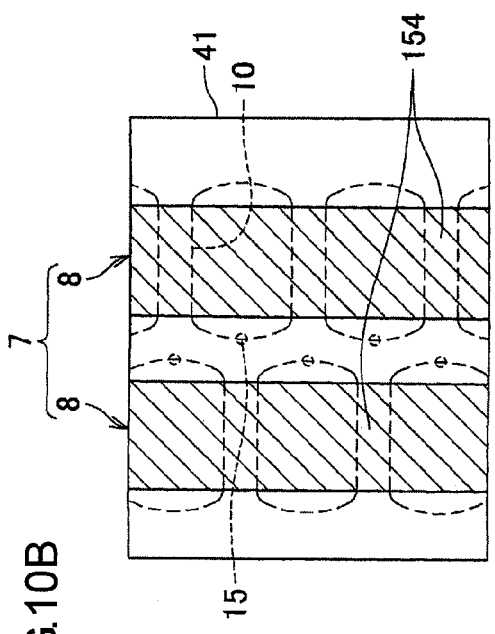

In Variation 2, as illustrated in FIG. 10B, a plurality of lower electrodes 154 are arranged between the piezoelectric layers 41 and 42 instead of the lower electrodes 144 according to Variation 1. The lower electrodes 154 are extended along the respective pressure chamber rows 8 in the paper feed direction (i.e., in the vertical direction in FIGS. 10A to 10D), and are opposed to the plurality of pressure chambers 10 constituting the pressure chamber rows 8. Thus, the regions of the piezoelectric layer 42 opposed to the approximate center portions of the pressure chambers 10 are sandwiched between the lower electrodes 154 and the intermediate electrode 145. Further, although not illustrated, at least one ends of the plurality of lower electrodes 154 in the paper feed direction are connected to each other via connecting portions each extending in the scanning direction.

(Variation 3)

Figure 11A:
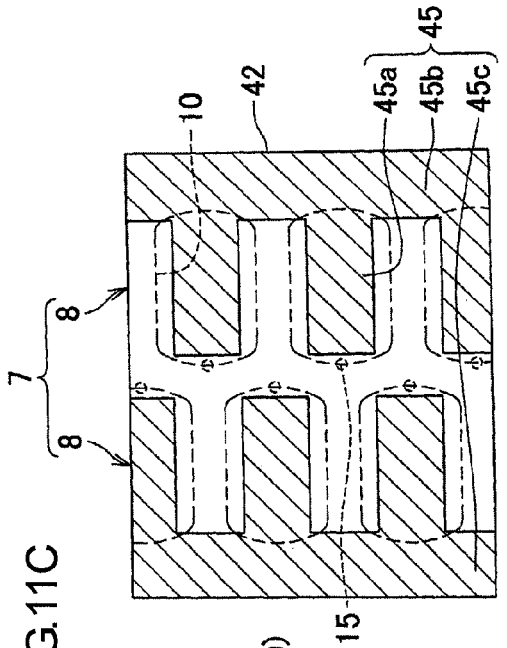
FIGS. 11A to 11D are diagrams according to Variation 3, which are equivalent to FIGS. 4A to 4D.
Figure 11C:
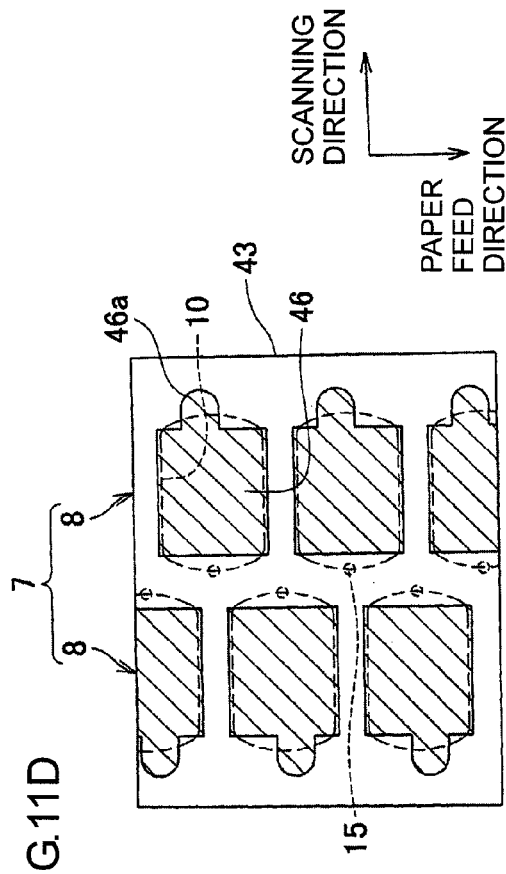
Figure 11B:
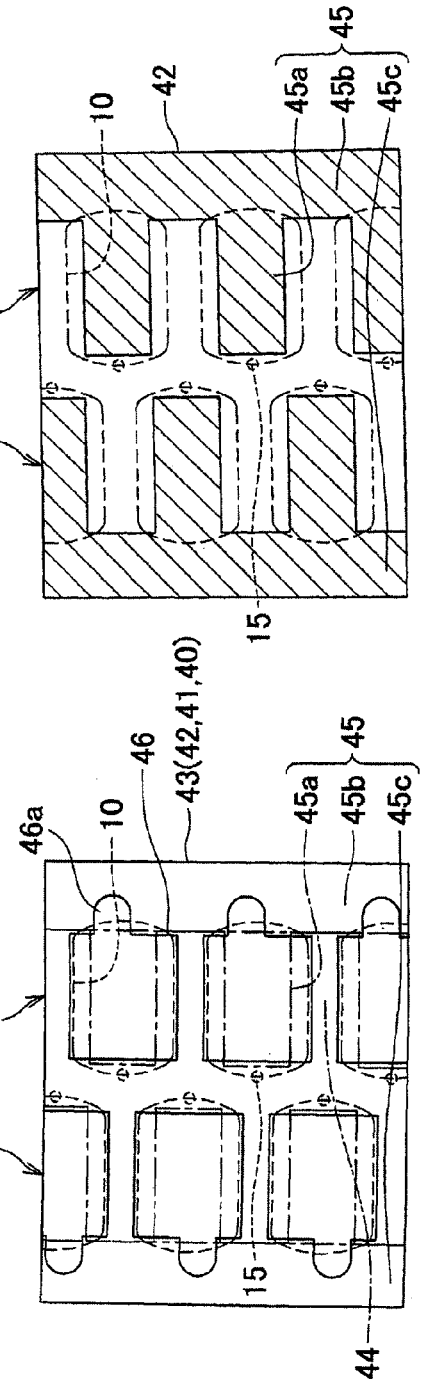
Figure 11D:
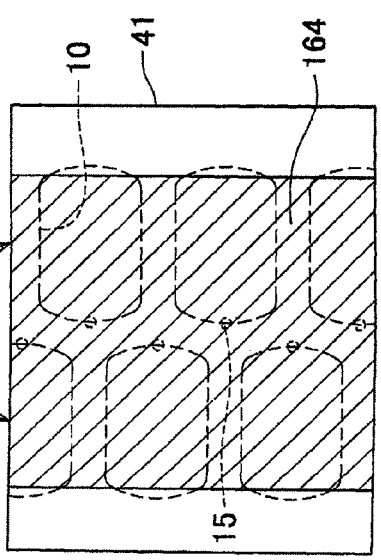

Furthermore, in Variation 3, as illustrated in FIG. 11B, a lower electrode 164 is arranged between the piezoelectric layers 41 and 42 instead of the lower electrode 44 according to the present embodiment. The lower electrode 164 continuously extends across the two pressure chamber rows 8 constituting each pressure chamber group 7. Thus, the intermediate electrode 45 and the lower electrode 164 are opposed to each other at regions thereof opposed to the approximate center portions of the pressure chambers 10. In other words, the regions of the piezoelectric layer 42, which are opposed to the approximate center portions of the pressure chambers 10, are sandwiched between the intermediate electrode 45 and the lower electrode 164.

Figure 12:
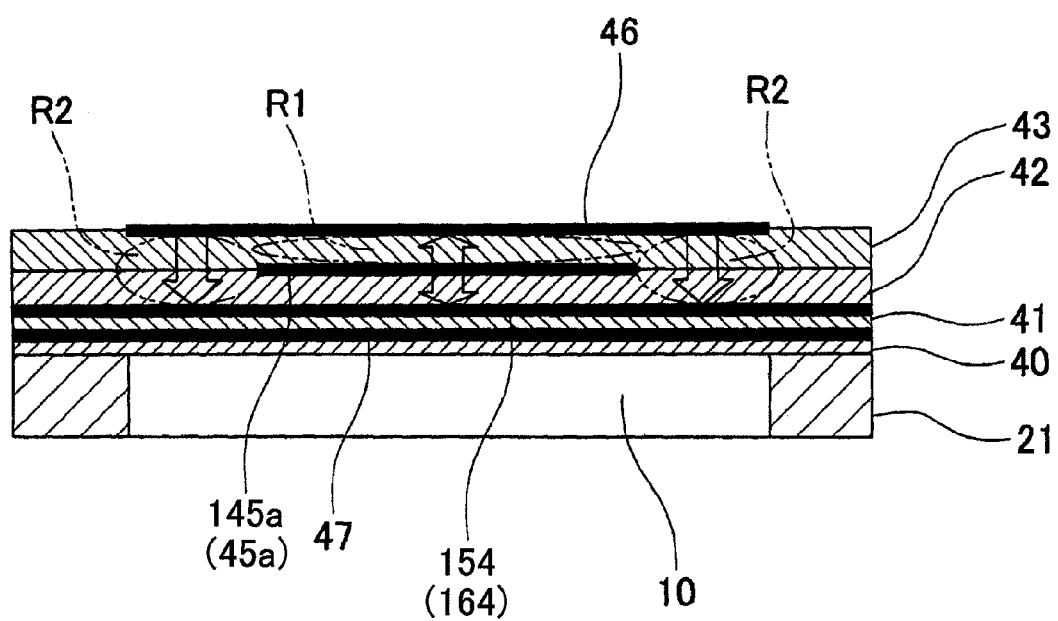
FIG. 12 is a diagram according to Variations 2 and 3, which is equivalent to FIG. 6.

It should be noted that the cross-sectional view of both of Variations 2 and 3, which is equivalent to FIG. 6, is FIG. 12. However, in FIG. 12, when the reference symbols to be used are different between Variation 2 and Variation 3, the reference symbols are used without brackets as for Variation 2, while the reference symbols are used with brackets as for Variation 3.

Also in Variations 2 and 3, the region of the piezoelectric layer 42, which is opposed to the connection portion between the vibration plate 40 and the flow passage unit 31, is not sandwiched between the intermediate electrode 145 and the lower electrodes 154 (or between the intermediate electrode 45 and the lower electrode 164). Therefore, similarly to the present embodiment, large stresses are not generated in the regions of the vibration plate 40 and the piezoelectric layers 41 to 43 opposed to the connection portion, and cracks can be prevented from being formed in the regions of the vibration plate 40 and the piezoelectric layers 41 to 43 opposed to the connection portion.

It should be noted that in Variations 2 and 3, the regions of the piezoelectric layer 42, which are opposed to the approximate center portions of the pressure chambers 10, are sandwiched between the intermediate electrode 145 and the lower electrodes 154 (or between the intermediate electrode 45 and the lower electrode 164), and said regions of the piezoelectric layer 42 are polarized downward toward the lower electrodes 154 from the intermediate electrode 145 (or toward the lower electrode 164 from the intermediate electrode 45). Furthermore, when the piezoelectric actuator is in the above-mentioned standby state or being driven, said regions of the piezoelectric layer 42 are constantly kept in the shrunk state.

(Variation 4)

Moreover, in the present embodiment, the piezoelectric layer 41 (see FIG. 5) is arranged between the vibration plate 40 and the piezoelectric layer 42, and the shielding electrode 47 (see FIG. 5) is arranged between the vibration plate 40 and the piezoelectric layer 41; however, the present invention is not limited to this structure.

Figure 13:
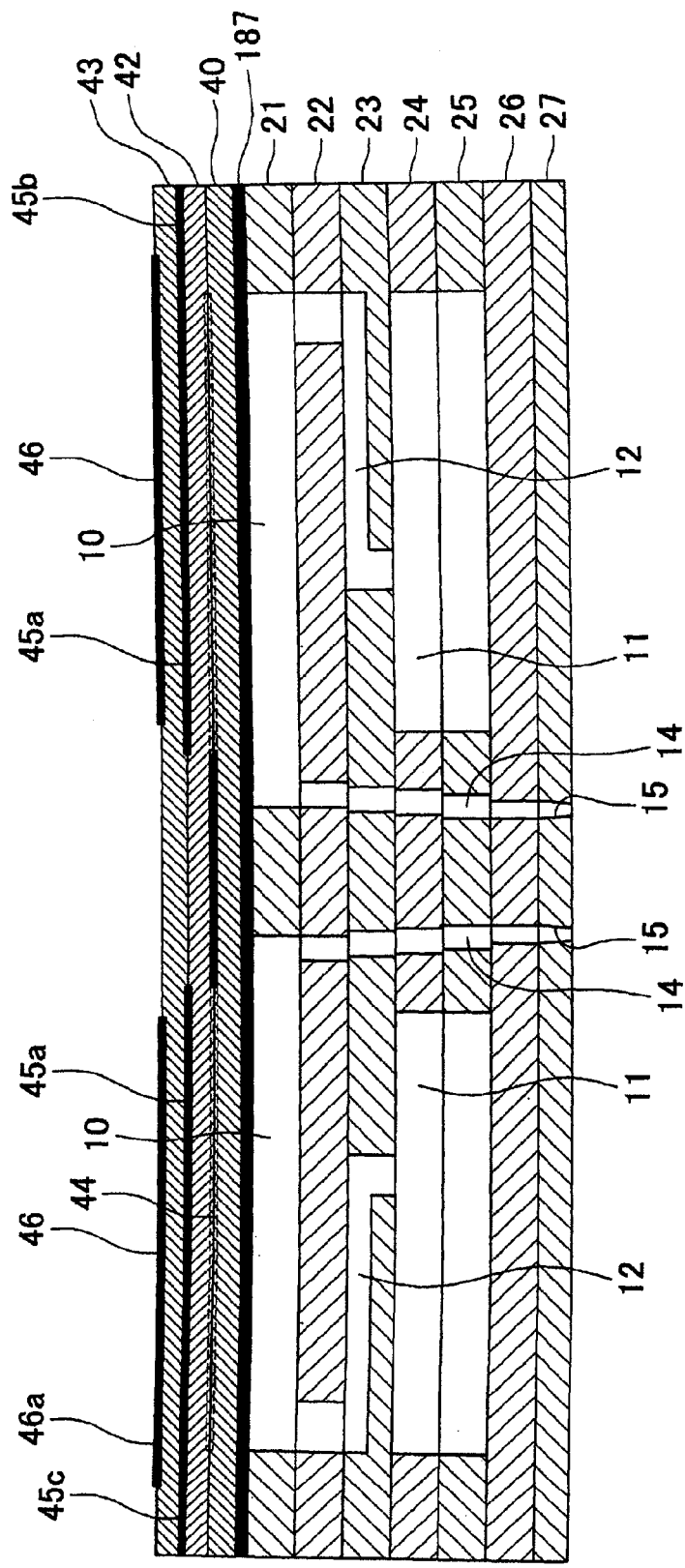
FIG. 13 is a diagram according to Variation 4, which is equivalent to FIG. 5.

In Variation 4, as illustrated in FIG. 13, no piezoelectric layer 41 is provided, the vibration plate 40 and the piezoelectric layer 42 are directly connected to each other, and a shielding electrode 187 made of a conductive material such as metal is formed across the entire lower face of the vibration plate 40. Further, the lower electrode 44 and the shielding electrode 187 are brought into conduction via at least one through hole (not illustrated) formed in the vibration plate 40, and the shielding electrode 187 and the lower electrode 44 are both maintained at the ground potential. It should be noted that in Variation 4, with the aim of obtaining the piezoelectric actuator drive characteristics similar to those of the present embodiment, the thickness of the vibration plate 40 is about 20 μm that is substantially the same as the sum of the thickness of the vibration plate 40 (about 10 μm) and the thickness of the piezoelectric layer 41 (about 10 μm) according to the present embodiment.

In Variation 4, since the shielding electrode 187 maintained at the ground potential is arranged at the lower face of the vibration plate 40, the shielding electrode 187 is interposed between the intermediate electrode 45 and the flow passage unit 31, thereby maintaining the flow passage unit 31 at the ground potential. Thus, the occurrence of some adverse effects on the flow passage unit 31 due to the potential of the intermediate electrode 45 can be prevented.

It should be noted that in Variation 4, the intermediate electrode 45 is maintained at the predetermined potential while the shielding electrode 187 is maintained at the ground potential. Therefore, an electric field is generated in the regions of the vibration plate 40 and the piezoelectric layer 42, which are sandwiched between the intermediate electrode 45 and the shielding electrode 187, in the thickness direction of these regions due to the potential difference between these electrodes, and stresses are generated in the regions of the vibration plate 40 and the piezoelectric layers 42 and 43, which are opposed to these sandwiched regions, as described above.

However, the distance (about 40 μm) between the intermediate electrode 45 and the shielding electrode 187 in the direction in which the vibration plate 40 and the piezoelectric layers 42 and 43 are stacked is greater than the distance (about 20 μm) between the intermediate electrode 45 and the lower electrode 44 by the thickness of the vibration plate 40. Accordingly, the electric field generated in the vibration plate 40 and the piezoelectric layer 42 is small as compared with the electric field generated in the piezoelectric layer 42 when the lower electrode 44 and the intermediate electrode 45 are opposed to each other. Thus, the stresses generated in the vibration plate 40 and the piezoelectric layers 42 and 43 are also small.

(Variation 5)

Figure 14:
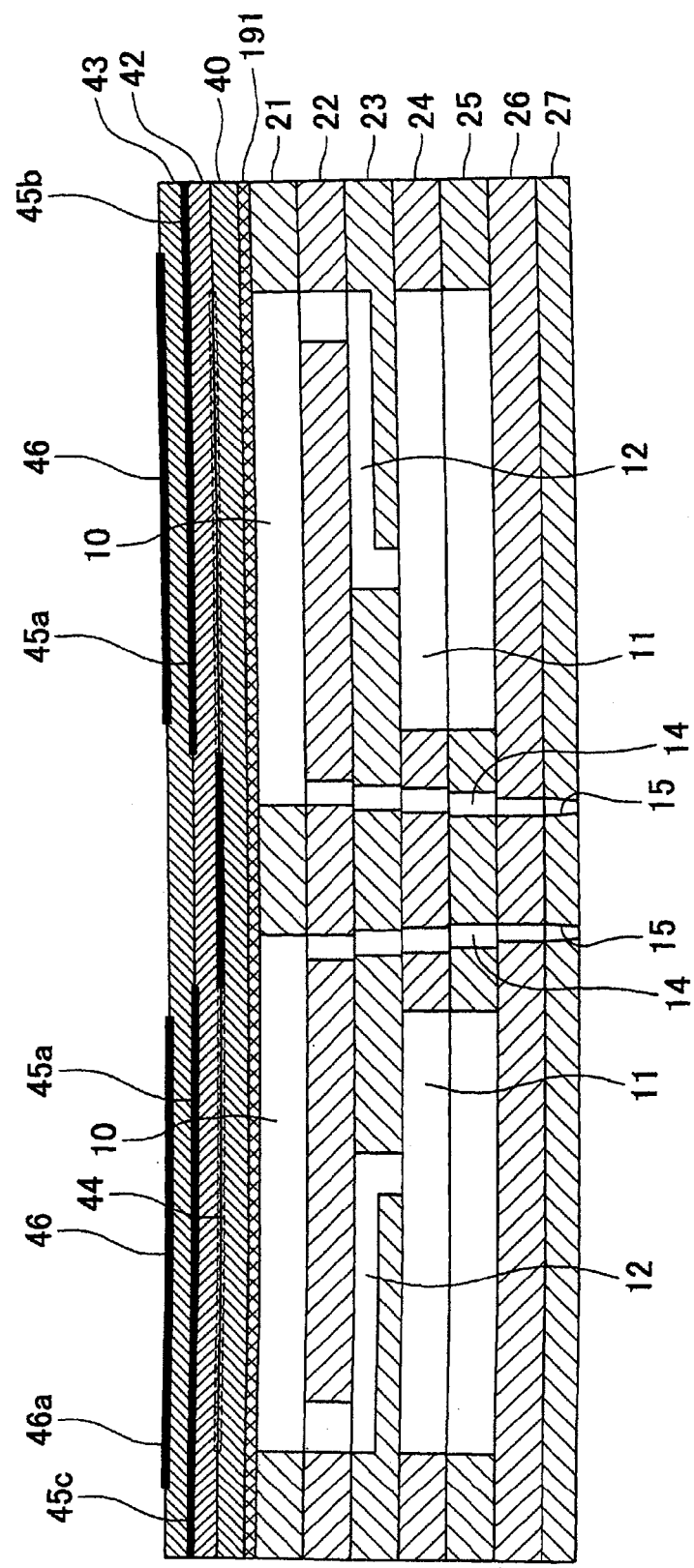
FIG. 14 is a diagram according to Variation 5, which is equivalent to FIG. 5.

Further, in Variation 5, as illustrated in FIG. 14, no piezoelectric layer 41 is provided similarly to Variation 4, the vibration plate 40 and the piezoelectric layer 42 are directly connected to each other, no shielding electrode is provided, and an insulating layer 191 is formed across the entire lower face of the vibration plate 40. Furthermore, the flow passage unit 31 is maintained at the ground potential. It should be noted that in Variation 5, with the aim of obtaining the piezoelectric actuator drive characteristics similar to those of the present embodiment, the thickness of the vibration plate 40 is about 20 μm that is substantially the same as the sum of the thickness of the vibration plate 40 (about 10 μm) and the thickness of the piezoelectric layer 41 (about 10 μm) according to the present embodiment.

In Variation 5, since the flow passage unit 31 is maintained at the ground potential, the occurrence of some adverse effects on the flow passage unit 31 due to the potential of the intermediate electrode 45 can be prevented.

In addition, in Variation 5, the intermediate electrode 45 is maintained at the predetermined potential while the flow passage unit 31 is maintained at the ground potential. Therefore, an electric field is generated in the regions of the vibration plate 40, the piezoelectric layer 42 and the insulating layer 191, which are sandwiched between the intermediate electrode 45 and the cavity plate 21 (flow passage unit), in the thickness direction of these regions due to the potential difference between these components, and stresses are generated in the regions of the vibration plate 40, the piezoelectric layers 42 and 43 and the insulating layer 191, which are opposed to these sandwiched regions, as described above.

However, in Variation 5, the distance (about 40 μm) between the intermediate electrode 45 and the insulating layer 191 in the direction in which the vibration plate 40 and the piezoelectric layers 42 and 43 are stacked is greater than the distance (about 20 μm) between the intermediate electrode 45 and the lower electrode 44 by the thickness of the vibration plate 40, and the electric field generated in the vibration plate 40 and the piezoelectric layer 42 is small as compared with the electric field generated in the piezoelectric layer 42 when the lower electrode 44 and the intermediate electrode 45 are opposed to each other. Thus, the stresses generated in the vibration plate 40, the piezoelectric layers 42 and 43 and the insulating layer 191 are small.

Furthermore, in Variation 5, voltage drop occurs not only in the piezoelectric layer 42 and the vibration plate 40 but also in the insulating layer 191, and therefore the amount of voltage drop that occurs in each of the piezoelectric layer 42, the vibration plate 40 and the insulating layer 191 is reduced as compared with the case where no insulating layer 191 is provided and voltage drop occurs only in the piezoelectric layer 42 and the vibration plate 40. As a result, the electric field generated in the regions of the piezoelectric layer 42, the vibration plate 40 and the insulating layer 191, sandwiched between the intermediate electrode 45 and the flow passage unit 31, is reduced as compared with the case where no insulating layer 191 is provided. Thus, the stresses generated in the vibration plate 40, the piezoelectric layers 42 and 43 and the insulating layer 191 are further reduced.

It should be noted that in the structure provided with no shielding electrode in this manner, the potential of the lower electrode 44 may be the first potential other than the ground potential, and either the potential of the lower electrode 44 (i.e., the first potential) or the potential of the intermediate electrode 45 (i.e., the second potential) may be selectively applied to the upper electrodes 46.

(Variation 6)

Figure 15:
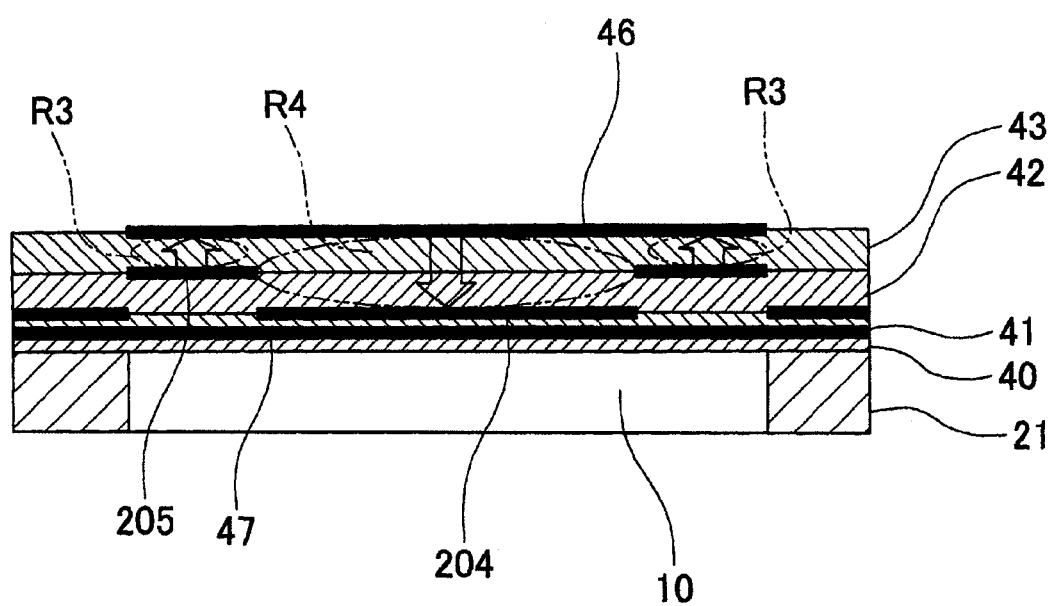
FIG. 15 is a diagram according to Variation 6, which is equivalent to FIG. 6.

In Variation 6, as illustrated in FIG. 15, lower electrodes 204 and an intermediate electrode 205 are provided instead of the lower electrode 44 and the intermediate electrode 45 (see FIG. 6) according to the present embodiment, respectively. It should be noted that the diagram according to Variation 6, which is equivalent to FIG. 5, is similar to that of the present embodiment (the reference symbols 44 and 45 in FIG. 5 are replaced with the reference symbols 204 and 205, respectively).

The intermediate electrode 205 is arranged at regions located between the piezoelectric layers 42 and 43 and surrounding the approximate center portions of the pressure chambers 10 in plan view. Unlike the lower electrode 44, the lower electrodes 204 are arranged at regions located between the piezoelectric layers 41 and 42 and opposed to the approximate center portions of the pressure chambers 10, but is not located at regions opposed to regions surrounding the approximate center portions of the pressure chambers 10.

Furthermore, by providing the electrodes 204 and 205 in this manner, the regions (active portions R3) of the piezoelectric layer 43, opposed to the regions surrounding the approximate center portions of the pressure chambers 10, are sandwiched between the intermediate electrode 205 and the upper electrodes 46, and these active portions R3 are polarized upward toward the upper electrodes 46 from the intermediate electrode 205. On the other hand, the regions of the piezoelectric layers 42 and 43 (or the regions thereof sandwiched between the upper electrodes 46 and the lower electrodes 204, i.e., active portions R4), opposed to the upper electrodes 46 and the lower electrodes 204 and opposed to the approximate center portions of the pressure chambers 10, which are not opposed to the intermediate electrode 205, are polarized downward toward the lower electrodes 204 from the upper electrodes 46.

In order to drive the foregoing piezoelectric actuator, first, in a standby state before an ink ejecting operation is carried out, the lower electrodes 204 and the intermediate electrode 205 are constantly maintained at the ground potential and the predetermined potential (e.g., 20 V), respectively, and the potentials of the upper electrodes 46 are each maintained at the ground potential in advance. In this state, the potential of each upper electrode 46 is lower than that of the intermediate electrode 205, and is similar to that of each lower electrode 204.

Thus, a potential difference is caused between each upper electrode 46 and the intermediate electrode 205, an upward electric field whose direction is equal to the polarization direction is generated in the active portions R3, and the active portions R3 are shrunk in the horizontal direction perpendicular to the direction of this electric field. Thus, so-called "unimorph deformation" occurs, thereby causing the regions of the piezoelectric layers 41 to 43 and the vibration plate 40, which are opposed to the pressure chambers 10, to be wholly deformed into a convex shape toward the side not facing toward the pressure chambers 10. In this state, the volumetric capacities of the pressure chambers 10 are increased as compared with the case where the piezoelectric layers 41 to 43 and the vibration plate 40 are not deformed.

Furthermore, when the piezoelectric actuator is driven with the aim of ejecting ink, the potential of each upper electrode 46 is switched to the predetermined potential. Then, the potential of each upper electrode 46 becomes equal to that of the intermediate electrode 205, and becomes higher than that of each lower electrode 204. Thus, the active portions R3 are each restored to its original state from the above-described shrinkage. Furthermore, concurrently with the restoration from the shrinkage, a potential difference is caused between each upper electrode 46 and each lower electrode 204, and a downward electric field whose direction is equal to the polarization direction is generated in the active portions R4, thereby causing the active portions R4 to be horizontally shrunk. Thus, the piezoelectric layers 41 to 43 and the vibration plate 40 are wholly deformed into a convex shape toward the pressure chambers 10, and the volumetric capacities of the pressure chambers 10 are reduced. Consequently, the pressure of ink inside the pressure chambers 10 is increased (i.e., pressure is applied to ink inside the pressure chambers 10), thereby ejecting ink from the nozzles 15 communicated with the pressure chambers 10. Then, after ink has been ejected from the nozzles 15, the potential of each upper electrode 46 is returned to the ground potential, thereby returning the piezoelectric actuator to the above-mentioned standby state.

In this case, upon switching of the potential of each upper electrode 46 from the ground potential to the predetermined potential when the piezoelectric actuator is driven in this manner, the active portions R3 are extended from the shrunk state to the pre-shrunk state, while the active portions R4 are shrunk; thus, the extension of the active portions R3 is partially absorbed by the shrinkage of the active portions R4. On the other hand, when the potential of each upper electrode 46 is switched to the ground potential from the predetermined potential to return the piezoelectric actuator to the foregoing standby state, the active portions R3 are shrunk, while the active portions R4 are extended to the pre-shrunk state, and therefore the shrinkage of the active portions R3 is partially absorbed by the extension of the active portions R4.

The above-described features suppress so-called "crosstalk" in which the deformation of the regions of the piezoelectric layers 42 and 43, which are opposed to the pressure chambers 10, is transmitted to regions opposed to the other pressure chambers 10, thus causing changes in the ejection properties of ink from the nozzles 15 communicated with said other pressure chambers 10.

Further, also in Variation 6, the region of the piezoelectric layer 42, which is opposed to the connection portion between the vibration plate 40 and the cavity plate 21 (flow passage unit), is not sandwiched between each lower electrode 204 maintained at the ground potential and the intermediate electrode 205 maintained at the predetermined potential. Therefore, similarly to the present embodiment, the above-described large stresses are not generated in the vibration plate 40 and the piezoelectric layers 41 to 43, and cracks can be prevented from being formed in the vibration plate 40 and the piezoelectric layers 41 to 43.

Furthermore, at the regions of the piezoelectric layer 42 surrounding the approximate center portions of the pressure chambers 10, each lower electrode 204 and the intermediate electrode 205 are not opposed to each other; therefore, said regions of the piezoelectric layer 42 are not kept in the shrunk state, and the deformation of the vibration plate 40 and the piezoelectric layers 41 to 43 are not hindered by the shrinkage of said regions of the piezoelectric layer 42 when the piezoelectric actuator is driven.

It should be noted that in Variation 6, an electric field is generated in the regions of the piezoelectric layers 41 and 42, sandwiched between the intermediate electrode 205 maintained at the predetermined potential and the shielding electrode 47 maintained at the ground potential, in the thickness direction of these regions due to the potential difference between these electrodes, and stresses are generated in the regions of the vibration plate 40 and the piezoelectric layers 41 to 43 opposed to these sandwiched regions. However, the distance (about 30 μm) between the intermediate electrode 205 and the shielding electrode 47 in the direction in which the vibration plate 40 and the piezoelectric layers 41 to 43 are stacked is greater than the distance (about 20 μm) between the intermediate electrode 205 and each lower electrode 204 by the thickness of the piezoelectric layer 41. Therefore, the electric field generated in the piezoelectric layers 41 and 42 is small as compared with the electric field generated in the vibration plate 40 and the piezoelectric layers 41 to 43 when the intermediate electrode 205 and each lower electrode 204 are opposed to each other. Thus, the stresses generated in the vibration plate 40 and the piezoelectric layers 41 to 43 are also small.

(Variation 7)

Moreover, in Variation 6, each lower electrode 204 maintained at the ground potential is arranged between the piezoelectric layers 41 and 42, the intermediate electrode 205 maintained at the predetermined potential is arranged between the piezoelectric layers 42 and 43, and the upper electrodes 46, to which either the ground potential or the predetermined potential is selectively applied, is arranged at the upper face of the piezoelectric layer 43; however, the present invention is not limited to this structure.

Figure 16A:
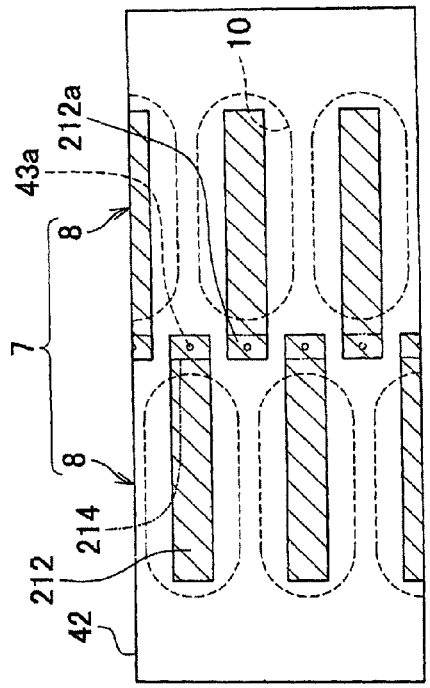
FIGS. 16A to 16D are diagrams according to Variation 7, which are equivalent to FIGS. 4A to 4D.
Figure 16C:
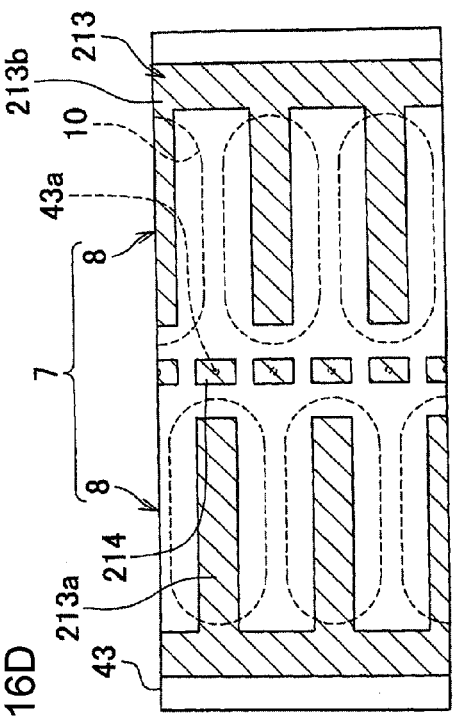
Figure 16B:
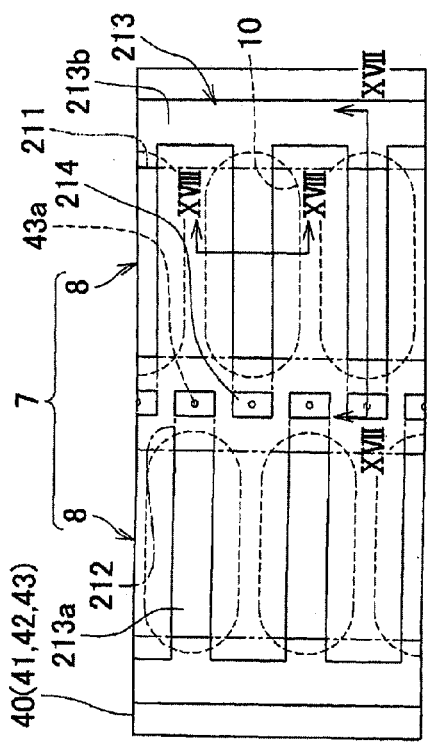
Figure 16D:
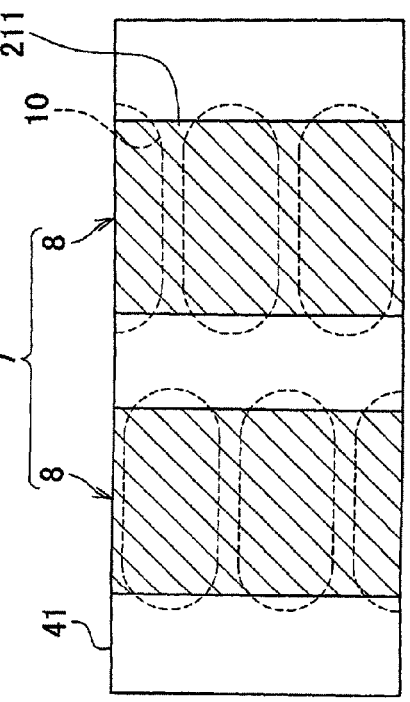
Figure 17:
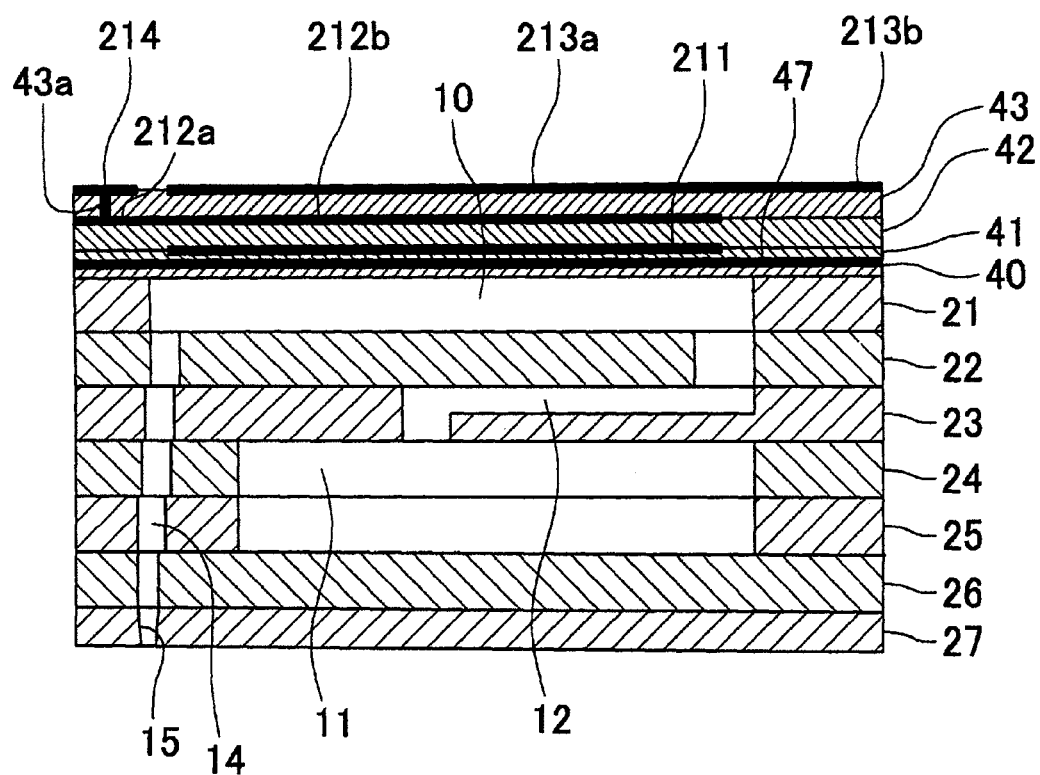
FIG. 17 is a cross-sectional view taken along a line XVII-XVII of FIG. 16A.
Figure 18:
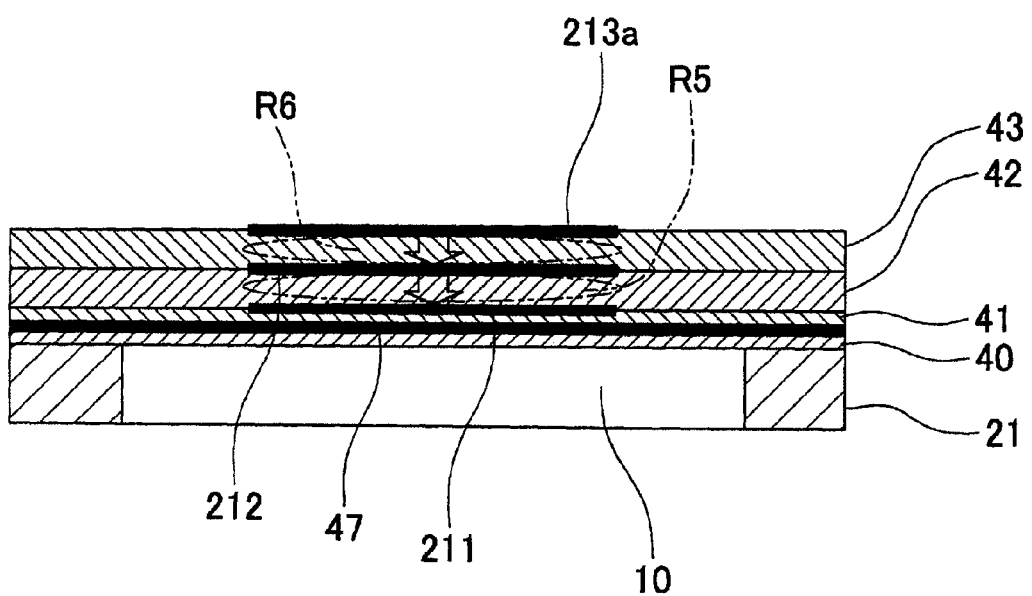
FIG. 18 is a cross-sectional view taken along a line XVIII-XVIII of FIG. 16A.

FIGS. 16A to 16D are diagrams according to Variation 7 described below, which are equivalent to FIGS. 4A to 4D. FIG. 17 is a cross-sectional view taken along a line XVII-XVII of FIG. 16A. FIG. 18 is a cross-sectional view taken along a line XVIII-XVIII of FIG. 16A. It is to be noted that electrodes are hatched in FIGS. 16B to 16D, and flow passages other than the pressure chambers 10 are not illustrated in FIG. 18.

In Variation 7, as illustrated in FIGS. 16A to 16D, 17 and 18, electrodes 211, 212 and 213 are provided between the piezoelectric layers 41 and 42, between the piezoelectric layers 42 and 43, and at the upper face of the piezoelectric layer 43, respectively.

The electrodes 211 (first drive electrode) are extended in the paper feed direction (i.e., in the vertical direction in FIG. 16B) so as to be opposed to the plurality of pressure chambers 10 constituting the respective pressure chamber rows 8. Further, although not illustrated, the electrodes 211 associated with the respective pressure chamber rows 8 are connected to each other, brought into conduction with the surface of the piezoelectric layer 43 via at least one through hole (not illustrated) each formed in the piezoelectric layers 42 to 43, and maintained at the ground potential.

The electrodes 212 (second drive electrode) are arranged so as to be opposed to the approximate center portions of the respective pressure chambers 10 in the paper feed direction. In addition, ends of the electrodes 212, located inwardly in the horizontal direction in FIG. 16C, are extended to regions that are not opposed to the pressure chambers 10, and tips of these ends serve as connecting terminals 212a. Via through holes 43a formed in the piezoelectric layer 43, the connecting terminals 212a are brought into conduction with surface electrodes 214 arranged at regions of the upper face of the piezoelectric layer 43, which are opposed to the connecting terminals 212a. Further, either the ground potential or the predetermined potential is selectively applied to the electrodes 212 via the surface electrodes 214.

The electrodes 213 (third drive electrode) have opposing portions 213a opposed to the approximate center portions of the respective pressure chambers 10 in the paper feed direction. The electrodes 213 further have connecting portions 213b that extend in the paper feed direction at the regions opposed to outside regions of the pressure chambers 10 in the scanning direction in FIG. 16D (i.e., the connection portion between the vibration plate 40 and the cavity plate 21 (flow passage unit 31)), and that connect outward ends of the opposing portions 213a in FIG. 16D. Furthermore, the electrodes 213 are maintained at the predetermined potential (e.g., about 20 V).

Further, the shielding electrode 47 is arranged between the vibration plate 40 and the piezoelectric layer 41 across the entire regions thereof, similarly to the present embodiment.

Moreover, since the electrodes 211 to 213 and the shielding electrode 47 are arranged as described above, the regions (active portions R5) of the piezoelectric layer 42 opposed to the approximate center portions of the pressure chambers 10 are sandwiched between the electrodes 211 and 212, and the active portions R5 are polarized downward toward the electrodes 211 from the electrodes 212. Further, the regions (active portions R6) of the piezoelectric layer 43 opposed to the approximate center portions of the pressure chambers 10 are sandwiched between the electrodes 212 and 213, and the active portions R6 are polarized downward toward the electrodes 212 from the electrodes 213. Furthermore, the region of the piezoelectric layers 42 and 43, opposed to the connection portion between the vibration plate 40 and the cavity plate 21 (flow passage unit), is not sandwiched between the electrodes 211 and 213.

In addition, in the foregoing piezoelectric actuator, the electrodes 212 are maintained at the ground potential in a standby state before the piezoelectric actuator is driven. In this state, a potential difference is caused between the electrodes 212 and 213, and an electric field whose direction is equal to the polarization direction is generated in the active portions R6 sandwiched between these electrodes. The active portions R6 are shrunk horizontally due to this electric field, and concurrently with this shrinkage, the regions of the vibration plate 40 and the piezoelectric layers 41 to 43, opposed to the pressure chambers 10, are wholly deformed into a convex shape toward the pressure chambers 10. Then, in this state, the volumetric capacities of the pressure chambers 10 are reduced as compared with the case where the vibration plate 40 and the piezoelectric layers 41 to 43 are not deformed.

Moreover, when the piezoelectric actuator is driven, the potential of each electrode 212 is temporarily switched to the predetermined potential, and is returned to the ground potential after a lapse of a predetermined period of time. Upon switching of the potential of each electrode 212 to the predetermined potential, the potential difference between the electrodes 212 and 213 is eliminated, and the piezoelectric layer 43 is returned to the pre-shrunk state; in addition, a potential difference is caused between the electrodes 212 and 211, and an electric field whose direction is equal to the polarization direction is generated in the active portions R5 sandwiched between these electrodes. The active portions R5 are shrunk horizontally due to this electric field, and concurrently with this shrinkage, the regions of the vibration plate 40 and the piezoelectric layers 41 to 43, opposed to the pressure chambers 10, are wholly deformed into a convex shape toward the side not facing toward the pressure chambers 10. Thus, the volumetric capacities of the pressure chambers 10 are increased, and ink flows into the pressure chambers 10 from the manifold flow passage 11.

Then, upon returning of the potential of each electrode 212 to the ground potential, the vibration plate 40 and the piezoelectric layers 41 to 43 are wholly deformed into a convex shape toward the pressure chambers 10 as described above, and the volumetric capacities of the pressure chambers 10 are reduced. Thus, the pressure of ink inside the pressure chambers 10 is increased (i.e., pressure is applied thereto), thereby ejecting ink from the nozzles 15 communicated with the pressure chambers 10.

In this case, the region of the piezoelectric layers 42 and 43, which is opposed to the connection portion between the vibration plate 40 and the cavity plate 21, is not sandwiched between the electrodes 211 maintained at the ground potential and the electrodes 213 maintained at the predetermined potential. Therefore, similarly to the present embodiment, the above-described large stresses are not generated in the vibration plate 40 and the piezoelectric layers 41 to 43, and cracks can be prevented from being formed in the vibration plate 40 and the piezoelectric layers 41 to 43.

It should be noted that in Variation 7, an electric field is generated in the regions of the piezoelectric layers 41 to 43, sandwiched between the electrodes 213 maintained at the predetermined potential and the shielding electrode 47 maintained at the ground potential, in the thickness direction of these regions due to the potential difference between these electrodes, and stresses are generated in the regions of the vibration plate 40 and the piezoelectric layers 41 to 43 opposed to these sandwiched regions. However, the distance (about 30 μm) between the electrodes 213 and the shielding electrode 47 in the direction in which the vibration plate 40 and the piezoelectric layers 41 to 43 are stacked is greater than the distance (about 20 μm) between the electrodes 213 and 211 by the thickness of the piezoelectric layer 41. Therefore, the electric field generated in the piezoelectric layers 41 to 43 is small as compared with the electric field generated in the piezoelectric layers 41 to 43 when the electrodes 211 and 213 are opposed to each other. Thus, the stresses generated in the vibration plate 40 and the piezoelectric layers 41 to 43 are also small.

In the above description, an example in which the present invention is applied to an ink jet head for ejecting ink from nozzles has been described, but the present invention may also be applicable to a liquid transfer device for ejecting or transferring liquid other than ink. In addition, when a vibration plate is connected to an object to be connected at a predetermined connection portion and is deformable at a deformable portion other than the connection portion, the present invention may also be applicable to a piezoelectric actuator used for a device other than a liquid transfer device.

According to the present embodiment, the first to third drive electrodes are arranged as described above, and the region of the first piezoelectric layer opposed to the connection portion is not sandwiched between the first and second drive electrodes; therefore, the above-described stresses can be prevented from being generated in the first piezoelectric layer. It should be noted that since the second piezoelectric layer is arranged on the side of the second drive electrode not facing toward the first drive electrode, the region of the second piezoelectric layer opposed to the connection portion is not sandwiched between the first and second drive electrodes.

The region of the second piezoelectric layer sandwiched between the third and second drive electrodes, and the regions of the second and first piezoelectric layers sandwiched between the third and first drive electrodes are deformed by switching the potential of the third drive electrode between the first and second potentials, thereby driving the piezoelectric actuator. Therefore, if the region of the first piezoelectric layer, opposed to the deformable portion, are opposed to the first and second drive electrodes, the region of the first piezoelectric layer sandwiched between these electrodes is brought to a constantly deformed state, and the deformation of the first and second piezoelectric layers for driving the piezoelectric actuator might be hindered.

However, in the present embodiment, the region of the first piezoelectric layer opposed to the deformable portion is not sandwiched between the first and second drive electrodes, thus preventing the occurrence of unnecessary deformation in the first piezoelectric layer.

When no shielding electrode is provided, the potential of the second drive electrode might cause some adverse effects on an object connected to the vibration plate.

However, in the present embodiment, the insulating layer is provided between the first piezoelectric layer and the vibration plate, and the shielding electrode is located at the region of the face of the insulating layer, which is adjacent to the vibration plate and opposed to at least the second drive electrode but not opposed to the first drive electrode; thus, the occurrence of some adverse effects on the object due to the potential of the second drive electrode can be prevented.

It should be noted that in such a structure, a potential difference is also caused between the shielding electrode maintained at the first potential and the second drive electrode maintained at the second potential, and the region of the first piezoelectric layer sandwiched between these electrodes will deform, thereby generating stresses in the region of the first piezoelectric layer opposed to the connection portion. However, the distance between the shielding electrode and the second drive electrode is greater than the distance between the first and second drive electrodes by the thickness of the insulating layer. Accordingly, as compared with the case where the region of the first piezoelectric layer, opposed to the connection portion, is opposed to the first and second drive electrodes, the electric field generated in the first piezoelectric layer is small, and the above-described stresses are also small.

Moreover, when the vibration plate is connected to the object, a foreign substance might enter between the vibration plate and the connection target, and cracks might be formed in the vibration plate, the first and second piezoelectric layers, and the insulating layer due to this foreign substance, thereby degrading the dielectric strength of the vibration plate, the first and second piezoelectric layers, and the insulating layer. However, significant degradation in the dielectric strength can be prevented even if the dielectric strength is degraded as described above because the dielectric strength is increased by the dielectric strength of the insulating layer.

According to the present embodiment, since the shielding electrode is provided across the entire surface of the insulating layer, the occurrence of some adverse effects on the object due to the potential of the second drive electrode can be prevented with reliability.

According to the present embodiment, the connecting portion of the second drive electrode is provided at the region located between the first and second piezoelectric layers and opposed to the connection portion, but the first drive electrode is not provided at the region that is located at the face of the first piezoelectric layer adjacent to the vibration plate and that is opposed to the connection portion. Therefore, the region of the first piezoelectric layer opposed to the connection portion is not sandwiched between the first and second drive electrodes, and the generation of stresses in the region of the first piezoelectric layer, opposed to the connection portion, due to the potential difference between these electrodes can be prevented.

According to the present embodiment, the first drive electrodes, located so as to be opposed to the plurality of areas surrounded by the opposing portions and connecting portion of the second drive electrode and not continuous with each other, are brought into conduction with the shielding electrode via the through hole formed in the insulating layer, thereby allowing the first drive electrode to be easily maintained at the first potential.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

What is claimed is:

1. A piezoelectric actuator comprising:
    a vibration plate that is connected to an object at a predetermined connection portion, and that has a deformable portion at a region different from the connection portion;
    a first piezoelectric layer arranged at one face side of the vibration plate;
    a second piezoelectric layer arranged at one face of the first piezoelectric layer; and
    three types of drive electrodes arranged at respective faces of the first piezoelectric layer and the second piezoelectric layer said respective faces not being in contact with each other, so as to be opposed to at least the deformable portion, respectively,
    wherein the three types of the drive electrodes include:
        a first drive electrode maintained at a first potential;
        a second drive electrode maintained at a second potential different from the first potential; and
        a third drive electrode, which is opposed to the first drive electrode and the second drive electrode at a region opposed to the deformable portion, and to which either the first potential or the second potential is applied,
    wherein the first piezoelectric layer and the second piezoelectric layer are not sandwiched between the first drive electrode and the second drive electrode at regions opposed to the connection portion,
    wherein the second drive electrode is arranged between the first piezoelectric layer and the second piezoelectric layer so as to be opposed to a part of the deformable portion, and
    wherein the first drive electrode is arranged at the other face of the first piezoelectric layer so as to be opposed to a region of the deformable portion which is different from said part,
    wherein the vibration plate includes a plurality of deformable portions,
    wherein the second drive electrode includes:
        a plurality of opposing portions opposed to the plurality of deformable portions, respectively; and
        a connecting portion that is opposed to the connection portion, and that connects the plurality of opposing portions to each other, and
    wherein the first drive electrode is arranged so as not to be opposed to the connecting portion.

2. The piezoelectric actuator according to claim 1,
    wherein the third drive electrode is arranged at a face of the second piezoelectric layer not facing toward the first piezoelectric layer so as to be opposed to the second drive electrode, and opposed to the first drive electrode without the second drive electrode.

3. The piezoelectric actuator according to claim 2,
    wherein the second drive electrode is arranged so as to be opposed to an approximate center portion of the deformable portion, and
    wherein the first drive electrode is arranged so as to be opposed to at least a region of the deformable portion which is located outside a region thereof opposed to the second drive electrode.

4. The piezoelectric actuator according to claim 2,
    wherein the first drive electrode is arranged at a region opposed to the deformable portion, so as not to be opposed to the second drive electrode.

5. A piezoelectric actuator comprising:
    a vibration plate that is connected to an object at a predetermined connection portion, and that has a deformable portion at a region different from the connection portion;
    a first piezoelectric layer arranged at one face side of the vibration plate;
    a second piezoelectric layer arranged at one face of the first piezoelectric layer; and three types of drive electrodes arranged at respective faces of the first piezoelectric layer and the second piezoelectric layer said respective faces not being in contact with each other, so as to be opposed to at least the deformable portion, respectively, wherein the three types of the drive electrodes include:
a first drive electrode maintained at a first potential;
a second drive electrode maintained at a second potential different from the first potential; and
a third drive electrode, which is opposed to the first drive electrode and the second drive electrode at a region opposed to the deformable portion, and to which either the first potential or the second potential is applied, wherein the first piezoelectric layer and the second piezoelectric layer are not sandwiched between the first drive electrode and the second drive electrode at regions opposed to the connection portion, wherein the first potential is a ground potential, and wherein the piezoelectric actuator further comprises:
an insulating layer arranged between the first piezoelectric layer and the vibration plate; and
a shielding electrode arranged at a face of the insulating layer not facing toward the first piezoelectric layer at a region opposed to at least the second drive electrode but not opposed to the first electrode, the shielding electrode being maintained at the first potential so as to shield application of the second potential of the second drive electrode to the object.

6. The piezoelectric actuator according to claim 5,
wherein the shielding electrode is arranged across the entire face of the insulating layer not facing toward the first piezoelectric layer.

7. The piezoelectric actuator according to claim 1,
wherein the plurality of deformable portions are arranged in one direction,
wherein the connecting portion connects ends of the plurality of opposing portions in a direction perpendicular to said one direction, and
wherein a plurality of the first drive electrodes are provided, and the plurality of first drive electrodes are arranged at a face of the first piezoelectric layer adjacent to the vibration plate so as to be opposed to a plurality of areas that are surrounded by the plurality of opposing portions and the connecting portion, and that are not continuous with each other.

8. The piezoelectric actuator according to claim 5,
wherein the first drive electrodes and the shielding electrode are connected to each other via a through hole formed in the insulating layer.

9. A liquid transfer device comprising:
a flow passage unit in which a liquid transfer flow passage including a pressure chamber is formed;
a piezoelectric actuator that changes a volumetric capacity of the pressure chamber, to apply pressure to liquid inside the pressure chamber; and
a drive part for applying a driving voltage to the piezoelectric actuator,
wherein the piezoelectric actuator comprises:
a vibration plate connected to the flow passage unit at a connection portion other than a region opposed to the pressure chamber;
a first piezoelectric layer arranged on a side of the vibration plate not facing toward the flow passage unit;
a second piezoelectric layer arranged at a face of the first piezoelectric layer not facing toward the vibration plate; and
first, second and third drive electrodes arranged at respective faces of the first piezoelectric layer and the second piezoelectric layer said respective faces not being in contact with each other, so as to be opposed to at least the pressure chamber, wherein the drive part applies a first potential to the first drive electrode, applies a second potential different from the first potential to the second drive electrode, and applies either the first potential or the second potential to the third drive electrode, wherein the first drive electrode is opposed to the connection portion and the pressure chamber, wherein the third drive electrode is arranged so as to be opposed to at least the pressure chamber, the first drive electrode and the second drive electrode, wherein the first piezoelectric layer and the second piezoelectric layer are not sandwiched between the first drive electrode and the second drive electrode at regions opposed to the connection portion, wherein the second drive electrode is arranged between the first piezoelectric layer and the second piezoelectric layer so as to be opposed to a part of the deformable portion, and wherein the first drive electrode is arranged at the other face of the first piezoelectric layer so as to be opposed to a region of the deformable portion which is different from said part.

10. A liquid transfer device comprising:
a flow passage unit in which a liquid transfer flow passage including a pressure chamber is formed;
a piezoelectric actuator that changes a volumetric capacity of the pressure chamber, to apply pressure to liquid inside the pressure chamber; and
a drive part for applying a driving voltage to the piezoelectric actuator,
wherein the piezoelectric actuator comprises:
a vibration plate connected to the flow passage unit at a connection portion other than a region opposed to the pressure chamber;
a first piezoelectric layer arranged on a side of the vibration plate not facing toward the flow passage unit;
a second piezoelectric layer arranged at a face of the first piezoelectric layer not facing toward the vibration plate; and
first, second and third drive electrodes arranged at respective faces of the first piezoelectric layer and the second piezoelectric layer said respective faces not being in contact with each other, so as to be opposed to at least the pressure chamber, wherein the drive part applies a first potential to the first drive electrode, applies a second potential different from the first potential to the second drive electrode, and applies either the first potential or the second potential to the third drive electrode, wherein the first drive electrode is opposed to the connection portion and the pressure chamber, wherein the third drive electrode is arranged so as to be opposed to at least the pressure chamber, the first drive electrode and the second drive electrode, wherein the first piezoelectric layer and the second piezoelectric layer are not sandwiched between the first drive electrode and the second drive electrode at regions opposed to the connection portion, wherein the first potential is a ground potential, and wherein the piezoelectric actuator further comprises:
an insulating layer arranged between the first piezoelectric layer and the vibration plate; and a shielding electrode arranged at a face of the insulating layer not facing toward the first piezoelectric layer at a region opposed to at least the second drive electrode but not opposed to the first electrode, the shielding electrode being maintained at the first potential so as to shield application of the second potential of the second drive electrode to the object.

* * * * *